US008572342B2

(12) United States Patent
Arai et al.

(10) Patent No.: US 8,572,342 B2
(45) Date of Patent: Oct. 29, 2013

(54) DATA TRANSFER DEVICE WITH CONFIRMATION OF WRITE COMPLETION AND METHOD OF CONTROLLING THE SAME

(75) Inventors: Masahiro Arai, Machida (JP); Hiroshi Hirayama, Yokohama (JP); Masanori Takada, Yokohama (JP); Hiroshi Kanayama, Odawara (JP); Hideaki Fukuda, Odawara (JP)

(73) Assignee: Hitachi, Ltd., Tokyo (JP)

( * ) Notice: Subject to any disclaimer, the term of this patent is extended or adjusted under 35 U.S.C. 154(b) by 289 days.

(21) Appl. No.: 12/747,086

(22) PCT Filed: Jun. 1, 2010

(86) PCT No.: PCT/JP2010/003661
§ 371 (c)(1),
(2), (4) Date: Mar. 30, 2011

(87) PCT Pub. No.: WO2011/151859
PCT Pub. Date: Dec. 8, 2011

(65) Prior Publication Data
US 2011/0296129 A1 Dec. 1, 2011

(51) Int. Cl.
*G06F 12/00* (2006.01)
*G06F 12/02* (2006.01)
(52) U.S. Cl.
USPC ............ 711/165; 711/E12.001; 711/E12.002
(58) Field of Classification Search
None
See application file for complete search history.

(56) References Cited

U.S. PATENT DOCUMENTS

2009/0248942 A1  10/2009 Kloeppner
2010/0031272 A1   2/2010 Gregg et al.

FOREIGN PATENT DOCUMENTS

JP          2008263436 A    10/2008

*Primary Examiner* — Edward Dudek, Jr.
*Assistant Examiner* — Ralph A Verderamo, III
(74) *Attorney, Agent, or Firm* — Volpe and Koenig, P.C.

(57) ABSTRACT

A data transfer device that confirms completion of writing into a memory on transferring data to the memory via a bus through which a response indicating completion of data writing in the memory is not sent back includes an inter-memory data transfer control unit performing data transfer between the memories. When the inter-memory data transfer control unit detects switching of a write destination memory from a first memory to a second memory, in order to confirm that writing into the first memory is completed, the inter-memory data transfer control unit performs confirmation of write completion as to the first memory by a procedure different from writing into the memory. When a data transfer with a designated transfer length is completed, in order to confirm that writing is completed as to the write destination memory at the end of the data transfer, the inter-memory data transfer control unit performs confirmation of write completion as to the write destination memory at the end of the transfer by the procedure different from writing into the memory. The inter-memory data transfer control unit notifies the processor of completion of an inter-memory data transfer based on the confirmation of write completion.

25 Claims, 17 Drawing Sheets

| MEMORY NUMBER | START ADDRESS | END ADDRESS | RATIO (reserved) | COUNTER |
|---|---|---|---|---|
| M0 | 13000h | 17FFFh | 5 | 5 |
| M1 | 23000h | 2FFFFh | 9 | 9 |
| M2 | 30000h | 3FFFFh | 16 | 16 |
| M3 | 40000h | 4FFFFh | 16 | 16 |
| M4 | 53000h | 57FFFh | 5 | 5 |
| M5 | 23000h | 2FFFFh | 9 | 9 |
| ... | ... | ... | ... | |

DATA TRANSFER DEVICE WITH CONFIRMATION OF WRITE COMPLETION AND METHOD OF CONTROLLING THE SAME

TECHNICAL FIELD

The present invention relates to a data transfer device and a method of controlling the same.

BACKGROUND ART

In storage devices (disk array systems and storage systems of this kind) of recent years, a cache memory is installed in a storage controller in order to increase the speed of reading and writing data. The cache memory holds a part of data to be written to a final storage medium such as a hard disk drive (hereinafter referred to as "HDD") or a solid state disk (hereinafter referred to as "SSD") or a part of data to be frequently read, thereby, hiding access latency of the medium and achieving a fast response to a host.

For example, when the host writes data to the storage device, a storage controller for processing the data provided in the storage device returns a write completion response to the host at the stage where the data is stored in the cache memory. Since the cache memory is much faster than a final storage medium, the host can issue the next I/O request immediately. Meanwhile, the storage controller operates so as to write the data in the cache memory to the final storage medium asynchronously with the operation of the host at a certain timing.

The storage controller is often configured of multiple controller units in order to improve fault tolerance. For this reason, cache memories (hereinafter, simply referred to as memories) are also arranged at multiple locations in a dispersed manner. For improvement in processing efficiency and redundancy by duplication, a data transfer is often executed between the memories. For such data transfer, a network path using an internal bus technology is formed between the controller units. For example, a standard such as PCI Express (registered trademark) is used for the bus. In addition, a data transfer controller called direct memory access (DMA) performs a data transfer between the cache memories according to a command by a processor executing storage control software.

In the case of PCI Express, so-called Posted Access is used in which the write request target does not issue a completion response (Completion) to the memory. In addition, buffers are provided on the path from the network path to the memory controller in the storage controller by reason of data processing by hardware. Accordingly, a source of write request cannot confirm whether or not data has passed through all the buffers on the path and has been written to the memory. For this reason, when data is written to a memory via a network path or the like, a dummy memory read request is issued via the same path in a storage device or the like to cause the buffers in the middle of the path to flush and then to ensure the writing of data to the memory. In PCI Express, a memory read request is called Non-Posted Access. The Non-Posted Access does not goes past Posted Access such as a memory write request and does not arrive at the memory before the Posted Access on the same path. Accordingly, if a response to the read request is returned, it is guaranteed that the write data according to the memory write request that has been issued in advance has passed through the buffers and has been written to the final memory.

Here, multiple network paths are set in some cases in order to secure a bandwidth because a transfer bandwidth achievable by a single path is limited. In order to efficiently perform a data transfer between multiple memories, it is necessary to evenly utilize the network paths. A technique to achieve load distribution through the network paths has been discussed heretofore as a method to eliminate unevenness and then to utilize the paths uniformly.

For example, Patent Literature (PTL) 1 discloses a method in which a hash value of a packet to be transferred is calculated, and a path is selected in accordance with the hash value. According to this method, the packet can be sent while the load is distributed to the multiple paths. Accordingly, the network transfer can be efficiently performed.

CITATION LIST

Patent Literature
PTL 1: Japanese Patent Application Laid-open Publication No. 2008-263436

SUMMARY OF INVENTION

Technical Problem

However, several problems occur when the aforementioned method is applied to a storage device or a data transfer system of this kind that performs the inter-memory data transfer between the controller units coupled to each other via a PCI Express bus or the like.

The first problem is a problem with the aforementioned dummy read. In a PCI Express bus or the like, it is guaranteed that Non-Posted Access stays behind Posted-Access in the same path. However, when Non-Posted Access passes through a different path, Non-Posted Access may arrive at the final memory before Posted Access that has been sent in advance. Since the purpose of sending a dummy read is to confirm that the writing is ensured by use of the characteristic that the dummy read stays behind a write request issued before the dummy read, the dummy read needs to be issued via the same path as that of the write request. However, according to the method in PTL 1, since the distribution of paths is performed on the basis of the hash value of a packet, there arises a problem that both of the request packets may not pass through the same path. The formats of both the packets are obviously different. Accordingly, the hash values of both the packets are extremely unlikely to be the same. In the first place, there is provided no mechanism of issuing a dummy read when a write request is issued. In addition, PTL 1 indicates that a different identifier, which is defined in advance, may be used instead of the hash value, as a modification. However, to realize the method using the identifier in PTL 1, it is required to prepare a memory table for storing correspondence between write packets and dummy read packets, and identification of paths through which each write packet has passed. The number of data packets to be transferred between the memories is enormous and amounts to hundred thousands to millions per second, thus simply searching the memory table will take very long time. Rather, the above processes will carry a different purpose for which the load distribution as a problem raised in PTL 1.

The second problem is that transfer time largely depends on the degree of concentration of access to a destination memory. The technique disclosed in PTL 1 performs load distribution on multiple paths, but the destination of data is a single device. Thus, it is considered that PTL 1 assumes that a data transfer is performed only through a network. The assumption in PTL1 is also apparent from the method disclosed by PTL 1, which performs load distribution by managing the degree of congestion of the path itself (use condition of data buffer). On the other hand, in the case of this storage device, access to a certain memory is not necessarily one through a network path, and an access by a DMA in the same storage controller in which the memory is provided also conflicts with another. Accordingly, load distribution cannot be always performed significantly even if only the degree of congestion of the path is managed.

The third problem is that the degree of congestion of a memory access is also attributable to a memory allocation method (memory usage layout) by control software. For example, consider a case where a memory channel 1 is allocated a control information area where access is relatively small, and a memory channel 2 is allocated a large number of cache areas where access is frequently made. In this case, if packets are passed through the network paths with an even ratio, the access to the memory channel 2 under passing through the network paths resultantly gets stack, and the packets of the subsequent memory channel 1 are thus accumulated. This problem cannot be solved by the conventional technique of load distribution on a network as proposed in PTL 1.

The present invention has been made in view of the aforementioned problems.

Specifically, an object of the present invention is to provide a data transfer device and its controlling method for ensuring writing to a memory without holding path information and additionally introducing control software even if the memory is coupled to multiple paths.

In addition, another object of the present invention is to provide a data transfer device and its controlling method for efficiently transferring data without causing unevenness in the paths even when access to a specific memory from inside and outside of a storage controller is concentrated.

Moreover, still another object of the present invention is to provide a data transfer device and its controlling method for performing an efficient transfer while memory usage information of upper level control software is taken into account.

Solution to Problem

In the present invention, for solving at least one of the aforementioned problems, provided is a data transfer device and its controlling method, the device having a DMA that detects a point of time when a memory channel (hereinafter, referred to as a memory plane) of a write destination of data switches to another during writing of data, and ensures the writing when the memory channel switches to another during the data writing or every time a series of transfers ends even in the same memory channel.

Moreover, in the present invention, for solving at least one of the aforementioned problems, provided is a data transfer device and its controlling method, the device having a status management mechanism for each DMA and path arbiter to refer to transfer status information of each other, and a determining unit for performing an efficient transfer on the basis of the information.

Furthermore, in the present invention, for solving at least one of the aforementioned problems, provided is a data transfer device and its controlling method for performing transfer amount control and a pass selection by utilizing memory layout information and priority information on each I/O, which is notified by the control software.

Advantageous Effects of Invention

According to the present invention, writing to a memory can be ensured in a network path using an internal bus technology in which a write response is not performed, without storing a write request issuance path by hardware for each packet, and without additionally introducing a control for ensuring writing from the control software.

In addition, according to the present invention, when multiple network paths are present, a path can be selected while a congestion situation of the destination memory is taken into account. Thus, an efficient transfer can be performed.

Moreover, according to the present invention, an efficient data transfer can be performed by the same hardware in accordance with the characteristics of the control software operating on the hardware.

DESCRIPTION OF EMBODIMENTS

An embodiment for carrying out the present invention will be described using Examples 1, 2 and 3. Note that, an embodiment that can be carried out by partially changing Examples will be described as a modification in each of Examples.

EXAMPLE 1

Example 1 will be described with reference to FIGS. 1 to 9.

Figure 1:
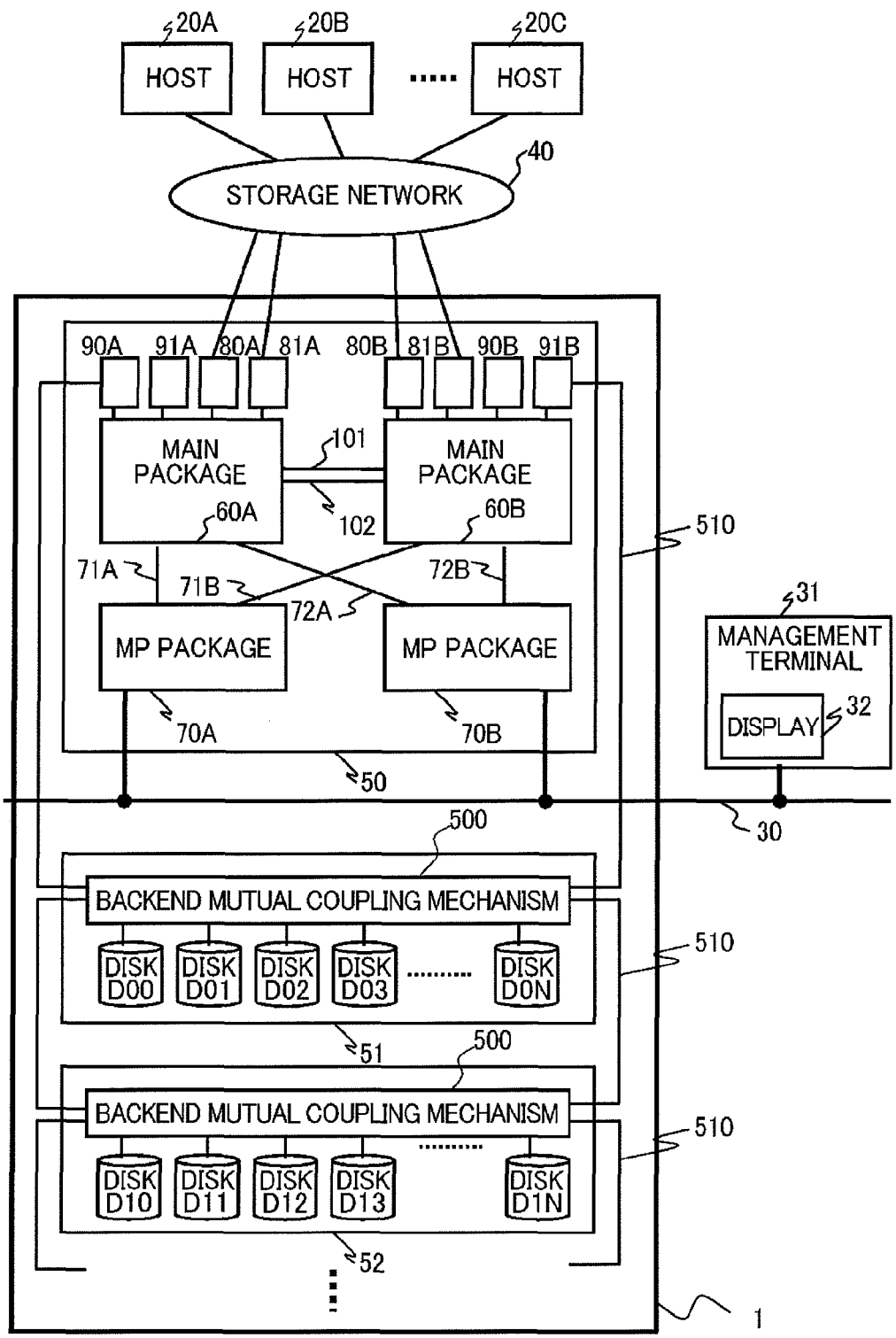
FIG. 1 is a block diagram showing a configuration of a storage device in an embodiment of the present invention.

FIG. 1 is a block diagram showing a configuration of a storage system in this embodiment. A storage device 10 includes multiple drive chassis 51, 52, . . . , and a storage controller chassis 50. The storage device 10 is coupled to a management terminal 31 via a management LAN 30, and setting or the like of the device can be performed via the management terminal 31. The management terminal 31 may be included in the storage device 10.

In addition, the storage device 10 is coupled to host computers 20A to 20C via a storage network 40. An operating system and an application operating thereon or a virtual machine is installed on the host computers 20A-20C, and thus the host computers 20A-20C issue an I/O to the storage device 10.

Sets of multiple disk drives D00 to D0N and D10 to D1N are installed in the drive chassis 51, 52, . . . , respectively. Each of the disk drives D00 to D1N is an HDD, an SSD or a final storage medium of this kind.

The disk drives D00 to D1N are coupled to disk array controller main packages 60A and 60B via backend mutual coupling mechanisms 500 provided in the drive chassis 51, 52, . . . , respectively, backend coupling cables 510, and I/F cards 90A and 91B provided in the storage controller chassis 50. Each of the backend mutual coupling mechanisms 500 is a SAS (Serial Attached SCSI) expander, for example, and each of the backend coupling cables 510 is a SAS cable, for example. In addition, each of the I/F cards 90A and 91B is an HBA (Host Bus Adapter) or the like on which a SAS protocol chip is mounted, for example. With this coupling, the storage controller can send and receive data to and from the disks.

The storage controller chassis 50 is provided with disk array controller main packages 60A and 60B, MP (micro processor) packages 70A and 70B having installed thereon processors for controlling the main packages 60A and 60B, the aforementioned I/F cards 90A and 90B for coupling with the drives, and I/F cards for coupling with the host computers 20A to 20C.

A storage control program operates in each of the MP packages 70A and 70B. Control lines 71A to 72B from the MP packages 70A and 70B are coupled to the disk array controller main packages 60A and 60B for sending instructions to the main packages 60A and 60B. Meanwhile, the disk array controller main packages 60A and 60B are coupled to each other via multiple internal data transfer paths 101 and 102 for mutually transferring data.

Note that, only the two packages, which are A-based and B-based packages, are shown in this embodiment, but more than two packages may be provided and may be coupled to each other, or the storage controller chassis themselves may be coupled to each other via I/F cards. For example, a part of the I/F cards 80A to 91B may be configured to be exchangeable with an I/F card for connecting between storage controller chassis 50. In addition, the aforementioned mutual couplings may be configured to be usable in the same manner as the internal data transfer paths 101 and 102.

Figure 2:
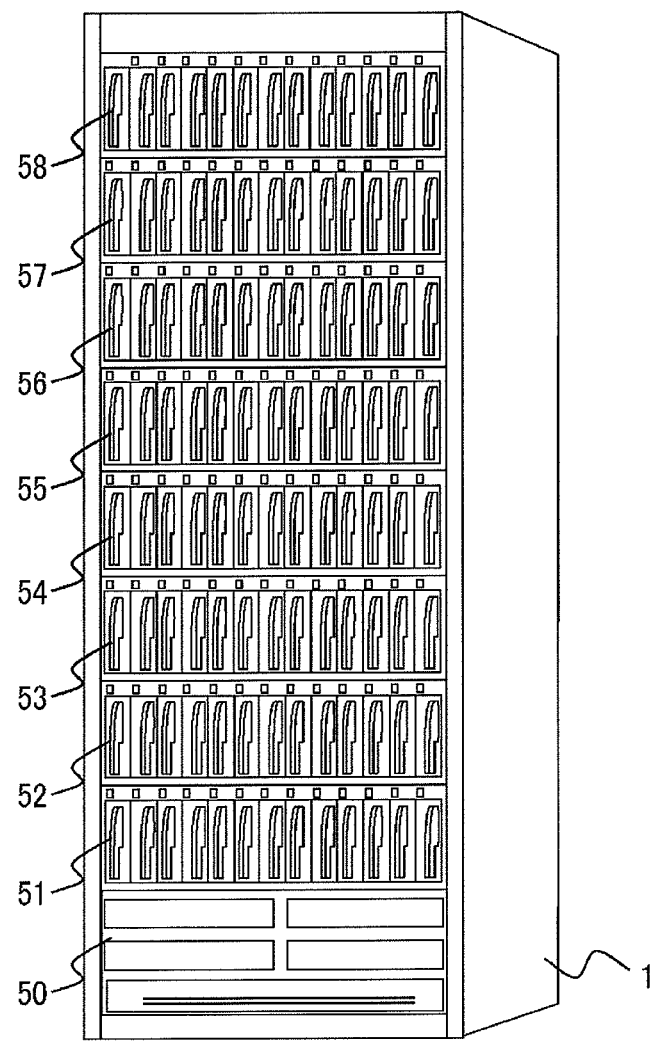
FIG. 2 is an external view showing the configuration of the storage device in the embodiment of the present invention.

FIG. 2 is an external view illustrated to facilitate understanding of the storage device in the present embodiment. The storage controller chassis 50 is installed at the lowermost level of the device, and the drive chassis 51 to 58 are shown on top of the controller chassis 50. Although not illustrated, cables for forming the above-described backend coupling cables and the storage network 40 are wired at the backside of the device.

Figure 3:
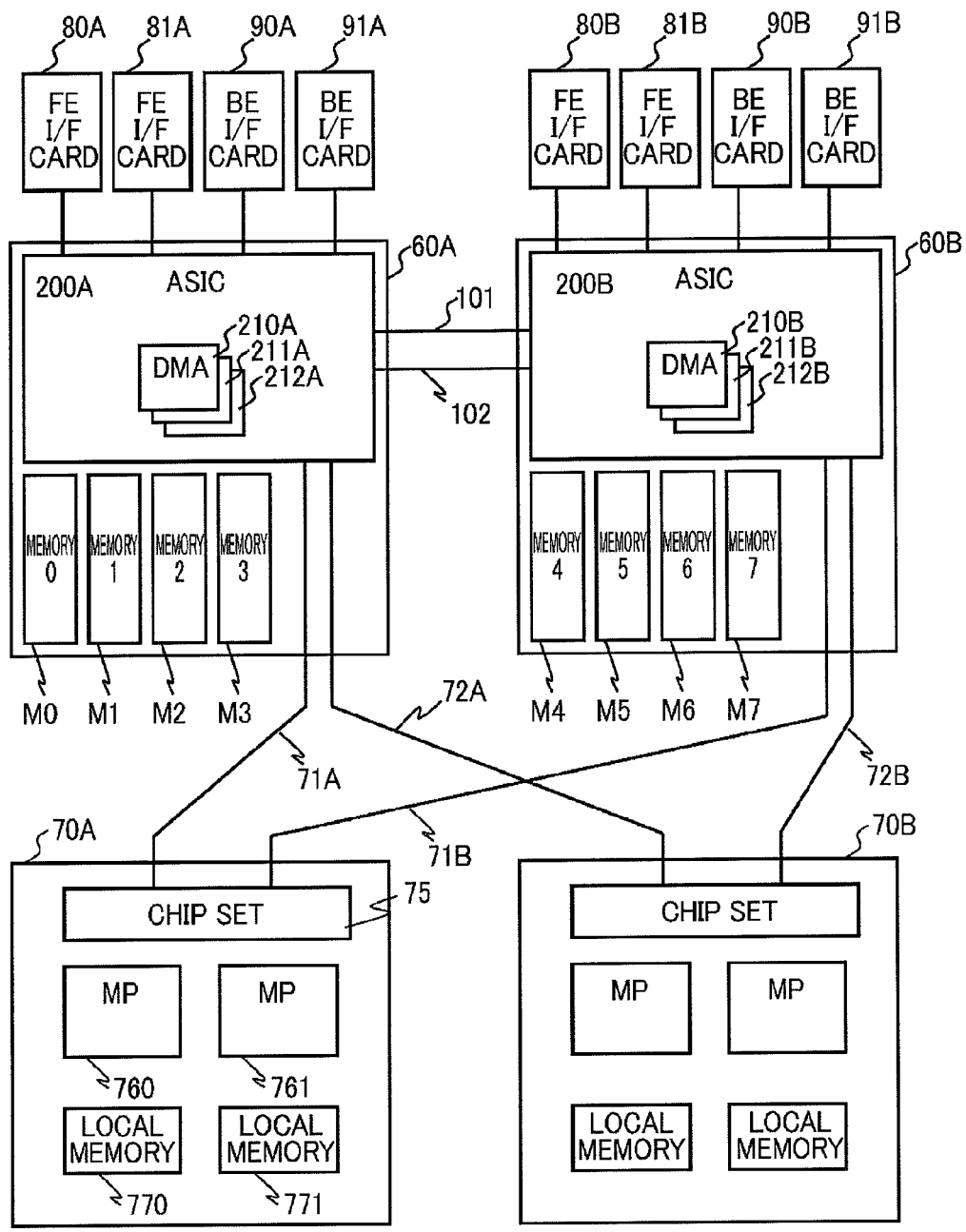
FIG. 3 is a block diagram showing a configuration of a storage controller of the storage device in the embodiment of the present invention.

FIG. 3 is a block diagram showing the internal configurations of the disk array controller main packages 60A and 60B as well as the MP packages 70A and 70B for controlling the disk array controller main packages 60A and 60B. In addition, the configuration of the I/F cards 80A to 91B connected thereto is shown in the block diagram.

Since the A-based and B-based systems are in a mutually symmetrical structure, hereinafter, the description will be given using the A-based system as the representative.

An ASIC (Application Specific Integrated Circuit) 200A and memories M0, M1, M2 and M3 are mounted on the disk array controller main package 60A. Various functions are implemented in the ASIC 200A. For example, DMAs (Direct Memory Access) 210A to 212A, which perform a transfer between memories, are provided in the ASIC 200A. Each of the memories M0 to M3 is a cache memory of the storage controller, and a DRAM (Dynamic Random Access Memory) or the like which is non-volatilized by battery or the like is used. DRAMs are often implemented as a DIMM (Dual Inline Memory Module). In addition, the disk array controller main package 60A is coupled to a group of I/F cards via the ASIC 200A. FE (Front-End) I/F cards 80A and 81A are the I/F cards for coupling to the hosts via the storage network 40. Each of the FE I/F cards includes a Fibre Channel protocol chip or the like installed thereon, and multiple host coupling ports.

Meanwhile, BE (Back-End) I/F cards 90A and 91A are coupled to the disks of the drive chassis 51, 52 via the backend cables 510.

In the MP package 70A, a processor chip set 75, processors 760 and 761 as well as local memories 770 and 771 are provided. Programs or the like that operate on these processors are stored in the local memories 770 and 771. Depending of the type or generation of the processor, the local memories 770 and 771 may be coupled to the chip set 75 or directly coupled to the processors 760 and 761. In addition, the chip set 75 may be embedded in the processors 760 and 761. The processors 760 and 761 are coupled to the ASICs 200A and 200B of the main packages 60A and 60B via the control lines 71A and 71B, and thus control the hardware. The control lines 71A and 71B are based on a technology such as a PCI Express, for example.

Figure 4:
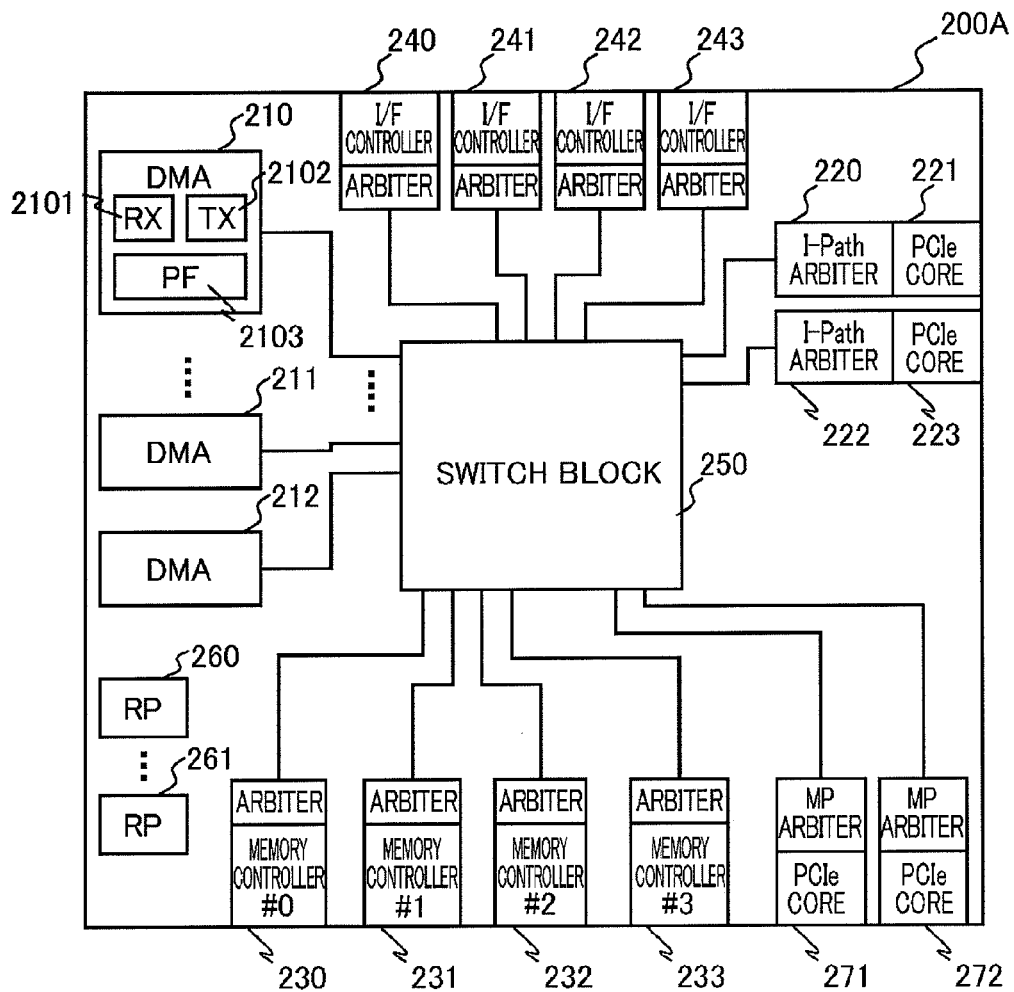
FIG. 4 is a block diagram showing an example of an internal configuration of an ASIC mounted on the storage controller in the embodiment of the present invention.

FIG. 4 is a diagram showing a configuration of the internal function blocks of each of the aforementioned ASICs 200A and 200B. In each of the ASICs 200A and 200B, there exist: the aforementioned DMAs 210, 211 and 212; PCI Express cores 221 and 223 which control PCI Express used as the internal data transfer paths (I-Path); internal data transfer path arbiters 220 and 222 for the internal data transfer paths 101 and 102; memory controllers 230, 231, 232 and 233; I/F controller blocks 240, 241, 242 and 243; processor ports 271 and 272; routing processors (RP) 260 and 261; and a switch block 250 for mutually coupling the aforementioned blocks with each other.

Each of the DMAs 210 to 212 (inter-memory data transfer control unit) is a transfer control block having a function to receive an instruction from the processors and then to copy only data from a certain memory address to another memory address only for the amount of a specified transfer length of the data. Each of the DMAs 210 to 212 is configured of: a read unit (RX) 2101, which reads data from a transfer source memory; a write unit (TX) 2102, which writes data to a transfer destination memory; and a parameter fetch unit (PF) 2103, which fetches a transfer parameter and then analyzes the transfer parameter. An instruction method relating to a data transfer and a start-up method of a transfer process will be described later in detail. Further, though there are provided three DMAs in the present embodiment, the number of the DMAs may be two or less, or four or more.

Each of the internal data transfer paths 101 and 102 is a network for performing a transfer between memories across the packages, and PCI Express is used for the internal data transfer paths 101 and 102 as described above. Each of the PCI Express cores 221 and 223 is a control block that performs a basic transmission and reception operation of PCI Express, more specifically hardware control, data link control, transaction protocol control and the like on a PCI Express bus. Each of the internal data transfer path arbiters 220 and 222 is an intermediate control block that adjusts network path usage requests from multiple control blocks, then grants the right of usage in accordance with a predetermined rule, and allows the usage. For example, when the DMA 210 and DMA 211 concurrently attempt data transmission, the internal data transfer path arbiters 220 and 222 performs arbitration processing such as first providing a right of use to the DMA 210 for its transmission and then providing a right of use to the DMA 211 for its transmission.

The memory controllers 230 to 233 are coupled to the memories M0 to M3 or M4 to M7, respectively. Each of the memory controllers 230 to 233 is a control block that writes and reads data into or from the memories M0, M1, M2, and M3, and the memories M4, M5, M6, and M7, and sends and receives a data packet based on requests from each of the DMAs 210 to 212 and other control blocks. The memory controllers 230 to 233 are respectively provided with arbiters (ARB) for adjusting the access sequence when accesses are concurrently made from multiple control blocks. The memory controllers 230 to 233 are also called a memory channel. A unique memory address space is allocated to the memory M0-M7 coupled to a corresponding one of the memory controllers 230 to 233.

The I/F control blocks 240 to 243 are blocks to which the aforementioned I/F cards 80A-81B and 90A-91B are coupled and perform data transmission with the I/F cards. The processor ports 271 and 272 are blocks to which the control lines 71A, 72A or the like are coupled and perform sending and receiving control information data by the processors 760, 761 and the ASIC 200, and further perform control of mutual communication by the processors 760A, 761A, 760B and 761B.

Each of the routing processors 260 and 261 is a control block that performs processing to distribute a command received from a protocol chip via the I/F controller blocks 240-243 to one of the processors 760A to 761B, which is responsible for the controlling of the command.

Various control blocks in addition to the aforementioned blocks may exist in the ASIC 200. For example, a hardware arithmetic control block such as a data compression or data encryption block, a dedicated memory access controller from a processor, or the like is considered as an optional block.

Figure 5:
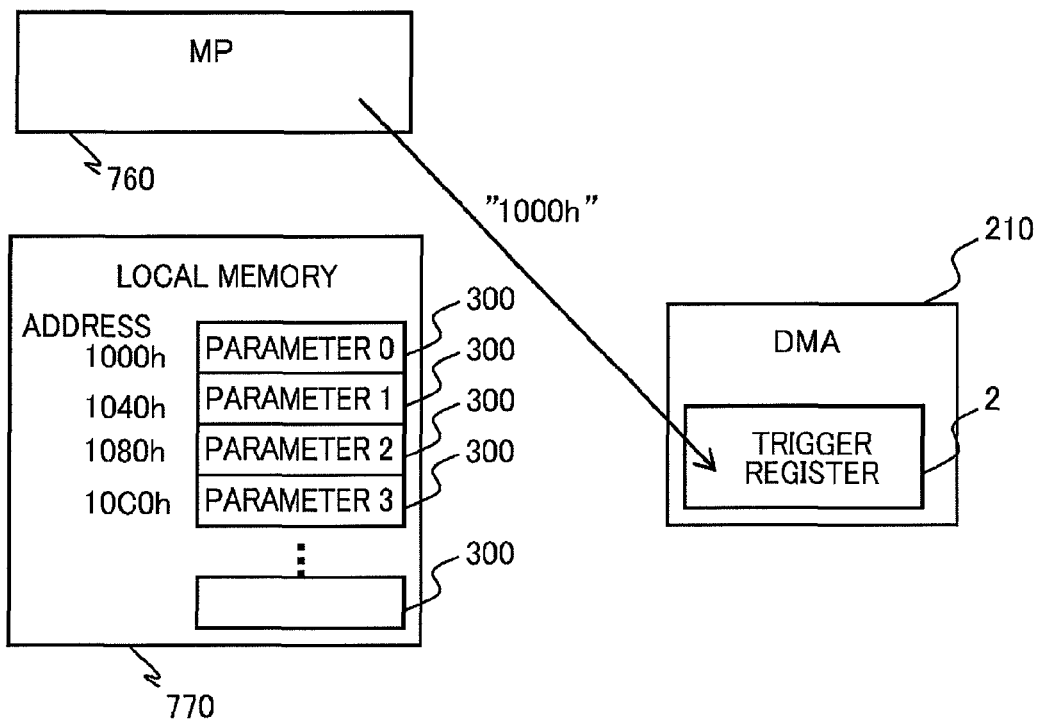
FIG. 5 is a diagram schematically showing a start-up method of a DMA controller in the embodiment of the present invention.

FIG. 5 is a diagram schematically showing a structure for the processors 760 and 761 to issue a transfer instruction to the DMAs 210 to 212 in the ASIC 200 in the present embodiment. Note that, the procedure to start any of the DMAs from any of the processors is the same in the description below. Accordingly, a case where the processor 760 starts the DMA 210 will be hereinafter described as the representative.

In a case where the processor 760 attempts to transfer data at a certain memory address to a different memory address by use of the DMA 210, the processor 760 builds a parameter 300 (transfer instruction parameter) on the local memory 770 for issuing a transfer instruction to the DMA 210. Although the parameter 300 is configured with a transfer source memory address, a transfer destination memory address, a transfer length and the like, the details thereof will be described later. Here, multiple parameters 300 are to be continuously written to the local memory 770.

The processor 760 continuously writes the number of the parameters 300 required for the attempted data transfer to the local memory 770, and sets, as the value in a start trigger register 2 of the DMA 210, a start address of the local memory 770 at which the top parameter 300 is stored. For example, in FIG. 5, since four parameters, parameter 0 to parameter 3 from an address 1000h (hex) of the local memory 770 are built, the processor 760 sets the value 1000h in the start trigger register 2 of the DMA 210.

When the value is set in the register 2, the DMA 210 reads the parameters 300 from the address indicated by the value of the local memory 770, then analyzes the parameters 300 and performs the data transfer instructed by the parameters 300. For example, in FIG. 5, since the value 1000h (hex) is set in the start trigger register 2, the DMA 210 operates to read the parameter 300 from the address 1000h of the local memory 770. The operation of the DMA 210 will be described later in detail.

Figure 6:
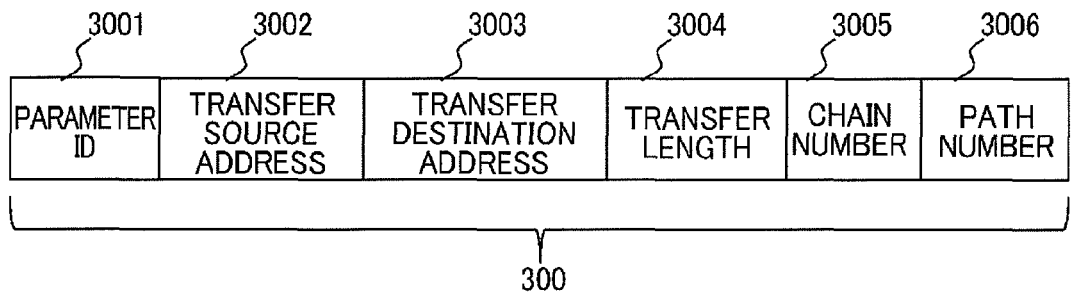
FIG. 6 is a diagram showing an example of a format of a transfer instruction parameter to the DMA controller in the embodiment of the present invention.

FIG. 6 is a diagram showing an exemplary format of the parameter 300 used by the processor 760 to issue a data transfer instruction to the DMA 210 in the present embodiment. A parameter ID field 3001 is a field where a unique number set for each of the parameters 300 is specified. A transfer source address field 3002 is a field where a start address of a memory that becomes a transfer source is specified. A transfer destination address field 3003 is a field where a start address of a memory that becomes a transfer destination is specified. A transfer length field 3004 is a field where a data length of data to be transferred is specified. A chain number field 3005 is a field where a grouping of the parameter 300 is specified. Each value in the chain number field 3005 is specified in the order from the chain number 3005 of "1" when there exists the other parameter 300 to be grouped, and the chain number 3005 of "0" is set as the last parameter 300 as grouped. Namely, the value in the chain number field 3005 is incremented by 1 and a group of the parameters 300 up to 0 are considered to be in one data transfer group. (When the chain does not exist, 0 is set as the chain number 3005.) When the chain number 3005 other than 0 is set, the DMA 210 does not terminate the processing at the processing for the parameter 300, but performs a chain operation to continuously execute data transfers instructed by the group of subsequent parameters 300, instead of ending the processing of one parameter 300. A path number field 3006 is a field where which number of the path among the multiple internal data transfer paths 101 and 102 is to be used is specified. Although one path number field 3006 is set in FIG. 6, multiple path number fields 3006 may be provided so that the internal data transfer paths 101 and 102 can be specified individually for cases where data is read, data is written, and the like. Note that, the configuration of the parameter 300 is only an example, and the parameter 300 may have another field required for different control.

Figure 7:
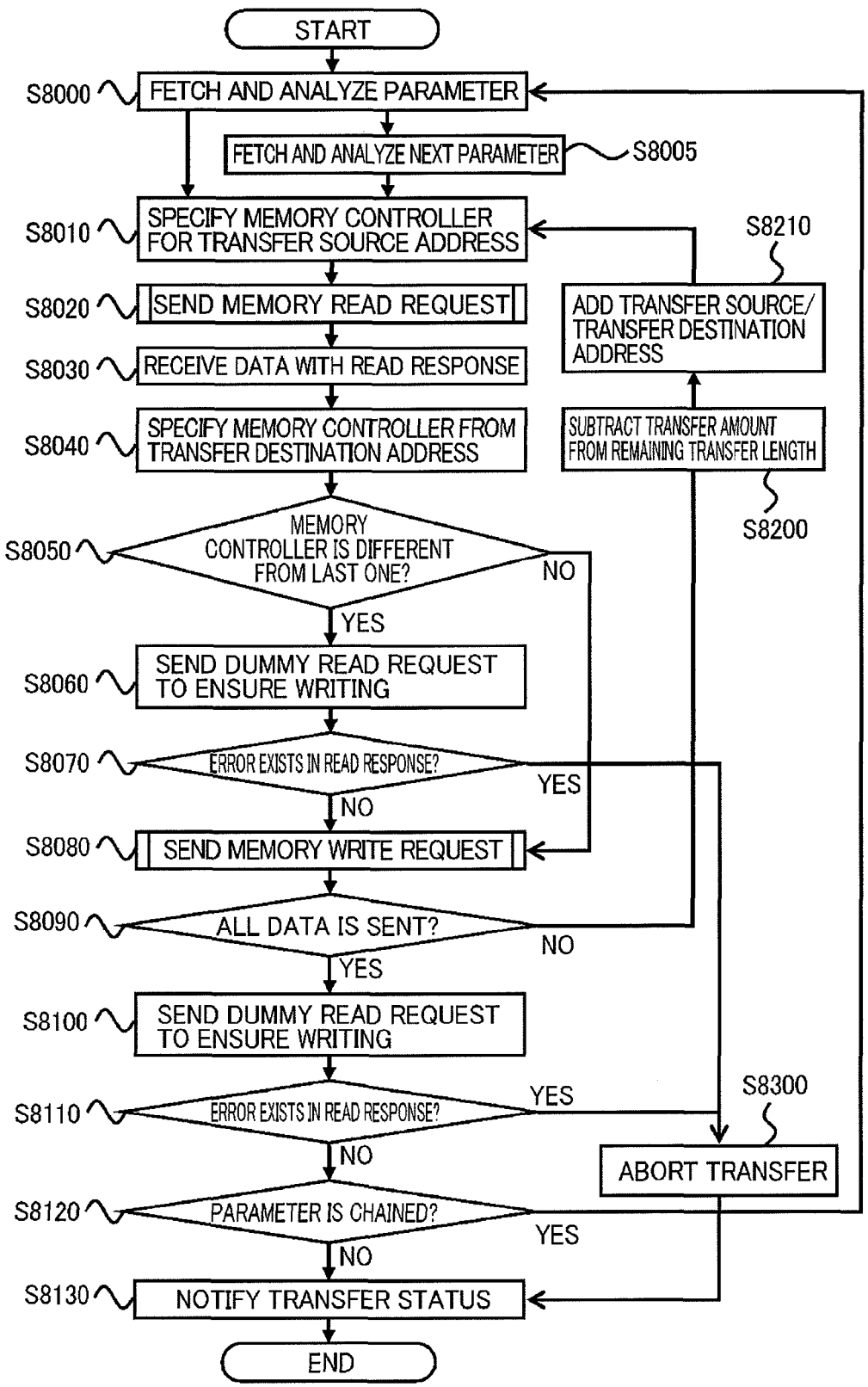
FIG. 7 is a flowchart showing an operation procedure of a DMA in the embodiment of the present invention.
Figure 8:
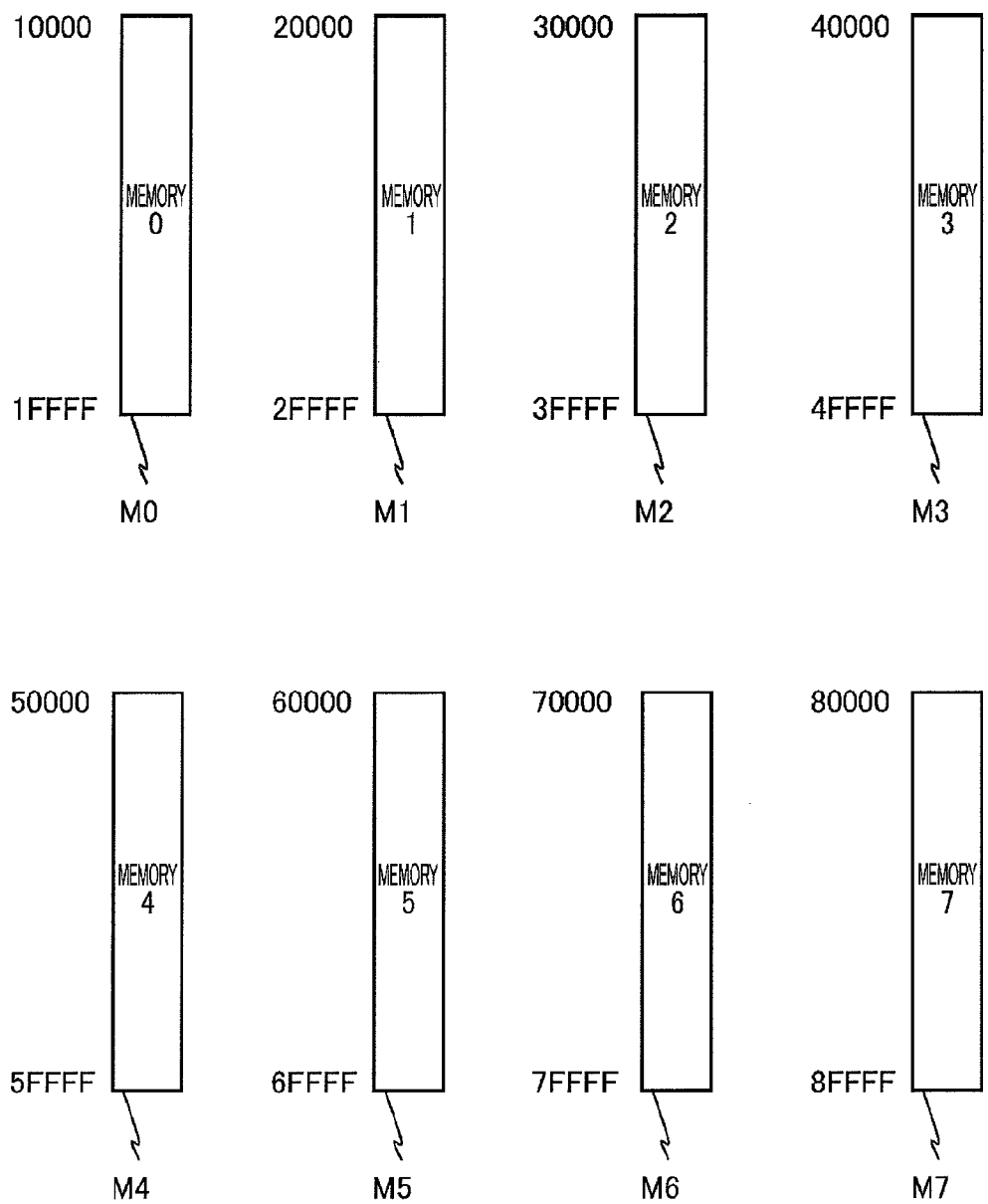
FIG. 8 is a diagram showing an example of a memory address map in the embodiment of the present invention.

FIG. 7 is a flowchart showing a data transfer operation of the DMA 210 in the present embodiment. The data transfer operation of the DMAs of the present embodiment will be described with reference to the drawing. Here, the data transfer operation automatically ensures writing during each period in which a write destination memory plane switches to another and each period in which a series of transfers ends.

The DMA 210 starts the operation in accordance with a start-up instruction from the processor 760. Although the operation starts when the processor 760 sets a value in the start trigger register 2 in the present embodiment, the DMA 210 may be configured to start on the event triggered by signal transmission via a signal line, a message transmission or the like. When a value is set in the start trigger register 2, the parameter fetch unit 2103 of the DMA 210 refers to the address of the local memory 770 indicated by the set value, then fetches one parameter 300 and analyzes the setting content (S8000). For example, the start address of the transfer source memory is acquired from the transfer source address field 3002, and the start address of the transfer destination memory is acquired from the transfer source address field 3003. In addition, the transfer length (total data transfer amount) is acquired from the transfer length field 3004. Here, when the DAM 210 starts once, fetching of the next parameter 300 is pre-fetched in the background (S8005).

The read unit 2101 of the DMA 210 specifies which memory controller is to be accessed from the transfer source address on the basis of the result of the analysis performed by the parameter fetch unit 2103 (S8010). For example, assume that the memory addresses are allocated in the manner shown in FIG. 8. When the transfer source address is an address 23000h, since the address is in the addresses of 20000h-2FFFFh allotted to the memory M1, the read unit 2101 determines that the memory controller 231 to which the memory M1 is coupled is to be accessed. Subsequently, the read unit 2101 issues a memory read request with respect to the memory controller 231, the request specifying the address to be accessed and the data length to be read (S8020). If the target memory controller is in the same ASIC 200, the memory read request is directly issued to the memory controller, and if the target memory controller is in the different ASIC 200, the memory read request is issued to the memory controller via the internal data path transfer path 101 or 102. The transfer length that the DMA 210 can transfer at a time is relatively small. For this reason, the data of the transfer length specified by the parameter 300 are sometimes transferred over multiple times. If the transfer length specified by the parameter 300 is larger than the transfer length that the DMA 210 can transfer at a time, the maximum transfer length that is transferable by the DMA 210 is specified as the data length. If the transfer length specified by the parameter 300 is equal to or smaller than the transfer length that the DMA 210 can transfer at a time, the transfer length specified by the parameter 300 is specified in the read request as the data length. For example, if the transfer length that the DMA 210 can transfer at a time is 2048 bytes, and the transfer length specified by the parameter 300 is 4096 bytes, 2048 bytes is specified in the read request as the data length to be read. Likewise, if the transfer length that the DMA 210 can transfer at a time is 512 bytes in this case, 512 bytes is specified in the read request as the data length to be read.

The memory controllers 230 to 233 read data of the transfer length specified in the read request from the memories M0 to M7 and then return a read response (Completion) to the read unit 2101 together with the read data, the data specified by the address specified in the read request. The read response is sent directly to the read unit 2101 if the DMA 210 is in the same ASIC 200. If the DMA 210 is in the different ASIC, the read response is sent to the read unit 2101 via the internal data transfer path 101 or 102. The read unit 2101 of the DMA 210 receives the read response with the data read from the corresponding one of the memory controllers 230 to 233 (S8030) and then stores the received data in a buffer inside the DMA 210.

When the data is stored in the buffer inside the DMA 210, the write unit 2102 of the DMA 210 specifies which one of the memory controllers 230 to 233 is to be accessed from the transfer destination address on the basis of the result of the analysis performed by the parameter fetch unit 2103 (S8040). For example, if the memory addresses are allocated in the manner shown FIG. 8, and the transfer destination address is an address 51000h, the write unit 2102 determines that the memory controller 230 to which the memory M4 is coupled is to be accessed.

For the second and subsequent parameters 300, if the memory controller specified as the aforementioned access destination is different from the memory controller specified last time in S8040 (S8050: Yes), the write unit 2102 issues a dummy read request to the memory controller specified last time (S8060). The dummy read request may be one that stays behind the memory write request that is issued previously, such as a memory read request whose transfer length is 0 (in other words, a request to be processed after writing to the memory for all of the memory write requests that are issued previously is completed). If the target memory controller to which the dummy read request is sent is in the same ASIC 200, the write unit 2102 issues the dummy read request directly to the memory controller, and if the target memory controller is in the different ASIC 200, the write unit 2102 issues the dummy read request to the memory controller via the internal data transfer path 101 or 102. Here, if a portion (buffer or the like) where data remains does not exists on the path from the DMA 210 to the memory controllers 230 to 233 in the same ASIC 200, the following configuration may be employed. Specifically, the issuance of the dummy read request may be omitted as long as the memory controller specified last time is in the same ASIC, even when the memory controller specified in S8040 this time is different from the memory controller specified in S8040 last time (S8050: Yes). The write unit 2102 determines if an error exists when a read response for the dummy read request is returned (S8070). If there is no error (S8070: No), the write unit 2102 sends a memory write request to the memory controller of a new access destination together with the data stored in the buffer inside the DMA 210 (S8080).

Note that, if the memory controller of the access destination is the same as the last time in S8050 (S8050: No), and also the parameter 300 read in S8000 is the same as the first one, the processing of S8060 and S8070 does not have to be performed, and only the processing of S8080 is performed.

In addition, if there is an error in the memory read response in S8070 (S8070: Yes), the write unit 2102, the read unit 2101 and the parameter fetch unit 2103 abort all of the data transfer processes for the parameter 300 and the subsequent parameters 300 chained to the parameter 300 (in other words, the series of the parameters 300 whose values are set in the chain number fields 3005 are continuously incremented from the parameter 300) (S8300) and then notify the processor 760, 761 of the status of termination due to an error.

The transfer length that the DMA 210 can transfer at a time is small in many cases as described above. For this reason, upon end of a transfer, the write unit 2102 accumulates the transfer amount until the last time and the transfer amount at this time, and then determines whether or not the accumulated transfer amount achieves the transfer length specified by the parameter (S8090). If the accumulated amount achieves the specified transfer length (S8090: Yes), the write unit 2102 lastly sends a dummy read request to the memory controller specified in S8040 and then ensures the writing of the data to the memory so far (S8100). The write unit 2102 then receives a read response from the memory controller for the dummy read request and then determines if an error exists (S8110). If there is an error, the write unit 2102 proceeds to S8300 and aborts the transfer in the manner described above. The read unit 2101 and the write unit 2102 notify the parameter fetch unit 2103 that the transferred amount has achieved the specified transfer length and wait for the next instruction. The parameter fetch unit 2103 determines whether or not the next parameter is chained (S8120). If the next parameter is not chained (S8120: No), the parameter fetch unit 2103 notifies the processor 760, 761 of the transfer end status (S8130), and terminates the data transfer process.

Here, if the accumulated transfer amount does not achieve the transfer length specified by the parameter 300 in S8090 (S8090: No), the write unit 2102 and the read unit 2101 subtract the transfer amount of this time from the remaining transfer length (S8200), then shift the transfer source address and the transfer destination address by the transfer length of this time (S8210) and then repeat the processing until the accumulated transfer amount achieves the transfer length specified by the parameter 300 (The process returns to S8010).

In addition, if a parameter 300 is chained in S8100 (S8100: Yes), the data transfer process for the next parameter 300 is performed subsequently. (The process returns to S8000.)

The DMA 210 of the present embodiment performs the data transfer process in the manner described above.

Here, in the actual control implementation, since the parameter fetch unit 2103, the read unit 2101 and the write unit 2102 may operate simultaneously in parallel with each other, each processing (S8000 to S8130) is performed in parallel with each other in terms of time in some cases. In addition, the three units which are the parameter fetch unit 2103, the read unit 2101 and the write unit 2102 are provided and assigned the roles in the manner described above in the present embodiment. However, another configuration may be employed as long as the configuration can fulfill the same functions as the DMA.

Figure 9:
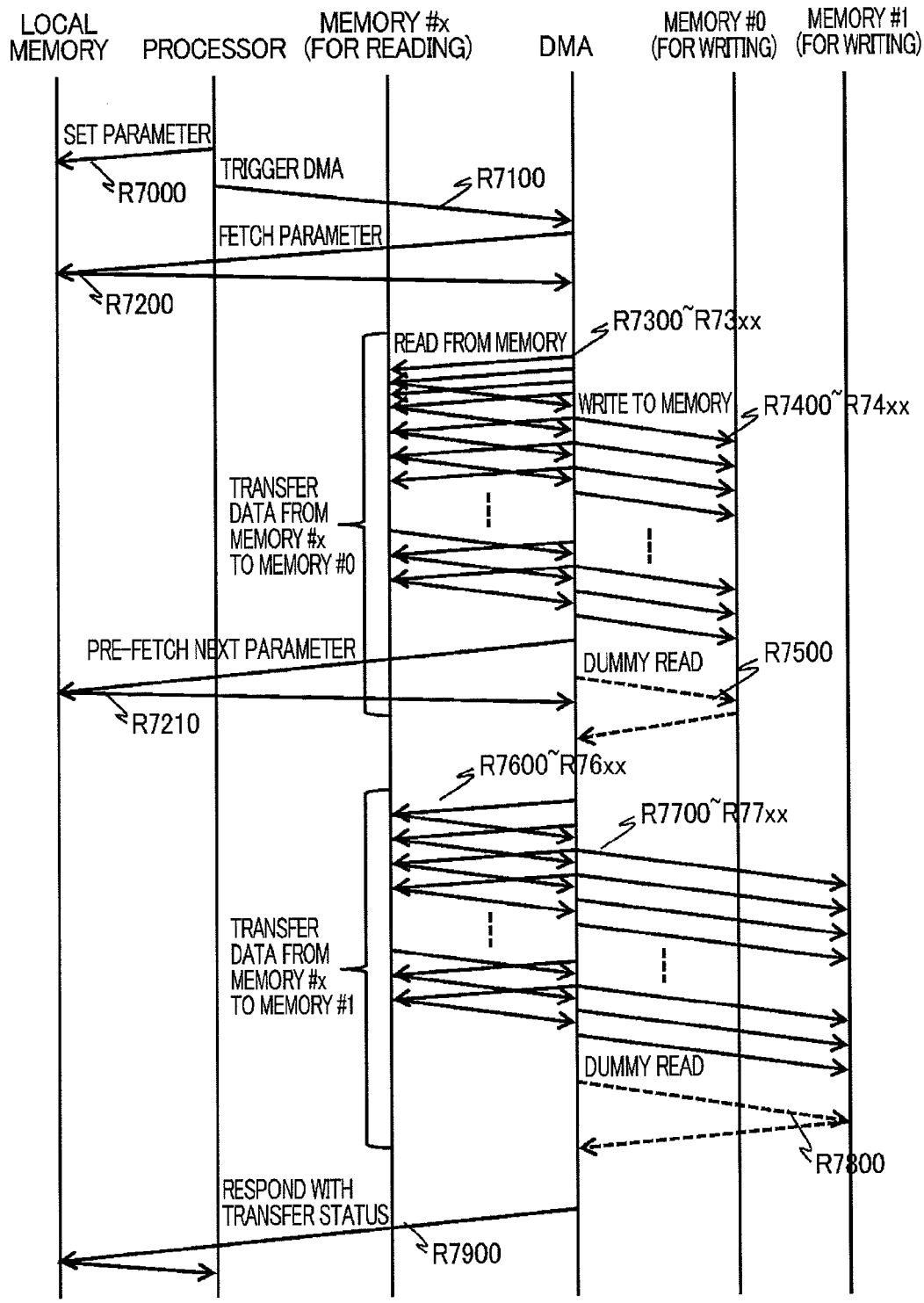
FIG. 9 is a ladder chart describing an entire operation of data transfer control between memories in the embodiment of the present invention.

FIG. 9 is a ladder chart showing an entire image of the data transfer control between the memories including the above described data transfer control of the DMA shown in FIG. 7 in the present embodiment. The vertical direction in the ladder chart shows the time passage, and the horizontal direction in the ladder chart shows the control between the resources as well as the flow of data. The resources herein are the local memories 770 and 771, the processors 760 and 761, the memories M0 to M7 and the DMAs 210 to 213. However, since the same resources perform the same operation, the reference numerals are omitted. Note that, the memory #x denotes a transfer source memory, and the memory #0 and the memory #1 denote transfer destination memories, respectively, and each of the memories is any one of the memories of the memory controllers 230-233 to which the memories M0 to M7 are coupled, respectively, and the transfer source and the transfer destination may be overlapped with another. The entire image of the data transfer control will be described with reference to the ladder chart.

The processor 760, 761 generates a group of the parameters 300 by the method shown in FIG. 5 on a local memory on the basis of the parameter format shown in FIG. 6 (R7000). The processor 760, 761 subsequently sets, in the trigger register 2 of a DMA, an address of the local memory in which the parameters 300 are generated, thereby, triggering the start of the DMA (R7100). The DMA fetches the first parameter 300 in the group of the parameters 300 from the local memory with reference to the trigger register 2 (R7200). In addition, as a background task, the DMA pre-fetches the next parameter 300 at an appropriate timing (R7210). The DMA analyzes the parameter 300, then reads data from the memory #n (R7300 to R73$xx$) and writes the data to the memory #1 in parallel with the reading process (R7400 to R74$xx$) on the basis of the result of the analysis. When the write destination memory plane switches from the memory #0 to the memory #1, the DMA issues a dummy read request to ensure the writing of the data performed so far (R7500). Then, the DMA subsequently continues the data reading (R7600 to R76$xx$) and also continues the writing of the data to the memory #1 (R7700 to R77$xx$). When the transfer for the transfer length specified by the parameter 300 is completed, the DMA issues a dummy read request to the final memory plane and thereby performs the processing to ensure the writing (R7800). If the subsequent parameter 300 is not chained, i.e., the chain number 3005 of the next parameter 300 is 0, the DMA returns the transfer status to the processor 760, 761 via the local memory (R7900).

Effects of Example 1

According to Example 1, write requests to the same memory controller 230-233 are continuously sent without ensuring the writing, and when a write request is sent to a memory controller 230-233 of a different write destination, a dummy read request can be sent to the previous memory controller 230-233. Since the requests to the same memory controller 230-233 are sent via the same path, the writing of the data for the write request issued previously can be ensured by sending a dummy read request to the previous memory controller 230-233 by use of Non-Posted Access, after the write request sent by use of Posted Access. Accordingly, even in a case where a protocol not issuing a completion response of wiring is used in the internal data transfer paths 101 and 102, the writing to a memory can be ensured without storing the issuance path of the write request for each packet. In addition, the path storage region for each packet becomes unnecessary. Thus, it is possible to achieve a downsizing of the implementation. Moreover, in this embodiment, each of the DMAs 210 to 212 can automatically send a dummy read request at the timing when the memories M0 to M7 of the write destinations switch from one to another and when writing ends. Thus, such an additional the processing as issuing a dummy read request by control software executed in the management terminal 31 or the host computer 20 is unnecessary. Accordingly, it is possible to achieve faster performance as the entire system.

Modification 1 of Example 1

In this embodiment, a dummy read request is issued to a corresponding one of the memories M0 to M7 in order to ensure writing. However, the embodiment may be modified so that a read request can be issued to a register of a corresponding one of the memory controllers 230 to 233, instead. Here, an assumption is made that the read request to the register uses Non-Posted Access. In this modification, no access for ensuring writing is made to the memories M0 to M7. Thus, it is possible to ensure writing faster, and there is an additional effect that improves use efficiency of the memories. Moreover, the aforementioned register of each of the memory controllers 230-233 may be provided with a function to record the number of write requests and then to set the number to 0 when the register is read. In this case, each of the DMAs 210 to 212 can determine a normal/abnormal state of the transfer by comparing the value read from the register with the number of the issued write requests. Accordingly, there is an additional effect that can further increase the reliability to ensure writing. The above register can be provided for each resource accessing the DMAs and the other memories or for each access area. Further, the memory controller 230-233 can be provided with a register for holding the number of read requests and the other statistic information in addition to the write requests.

Modification 2 of Example 1

Figure 10:
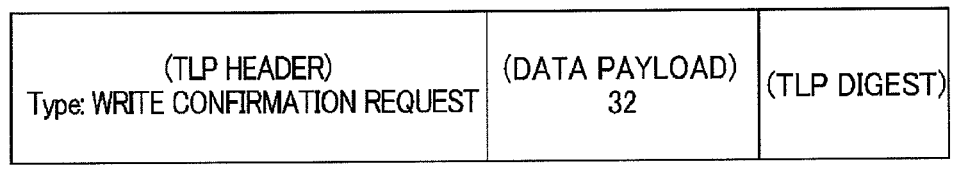
FIG. 10 is a diagram showing a configuration example of a write confirmation request in a modification of the embodiment of the present invention.
Figure 11:
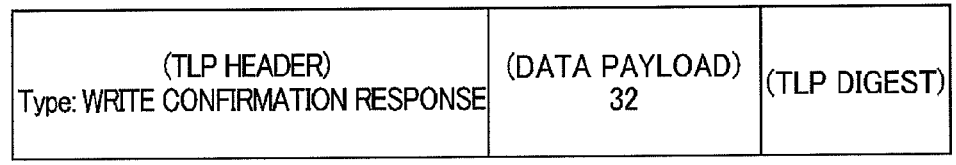
FIG. 11 is a diagram showing a configuration example of a write confirmation response in the modification of the embodiment of the present invention.
Figure 12:
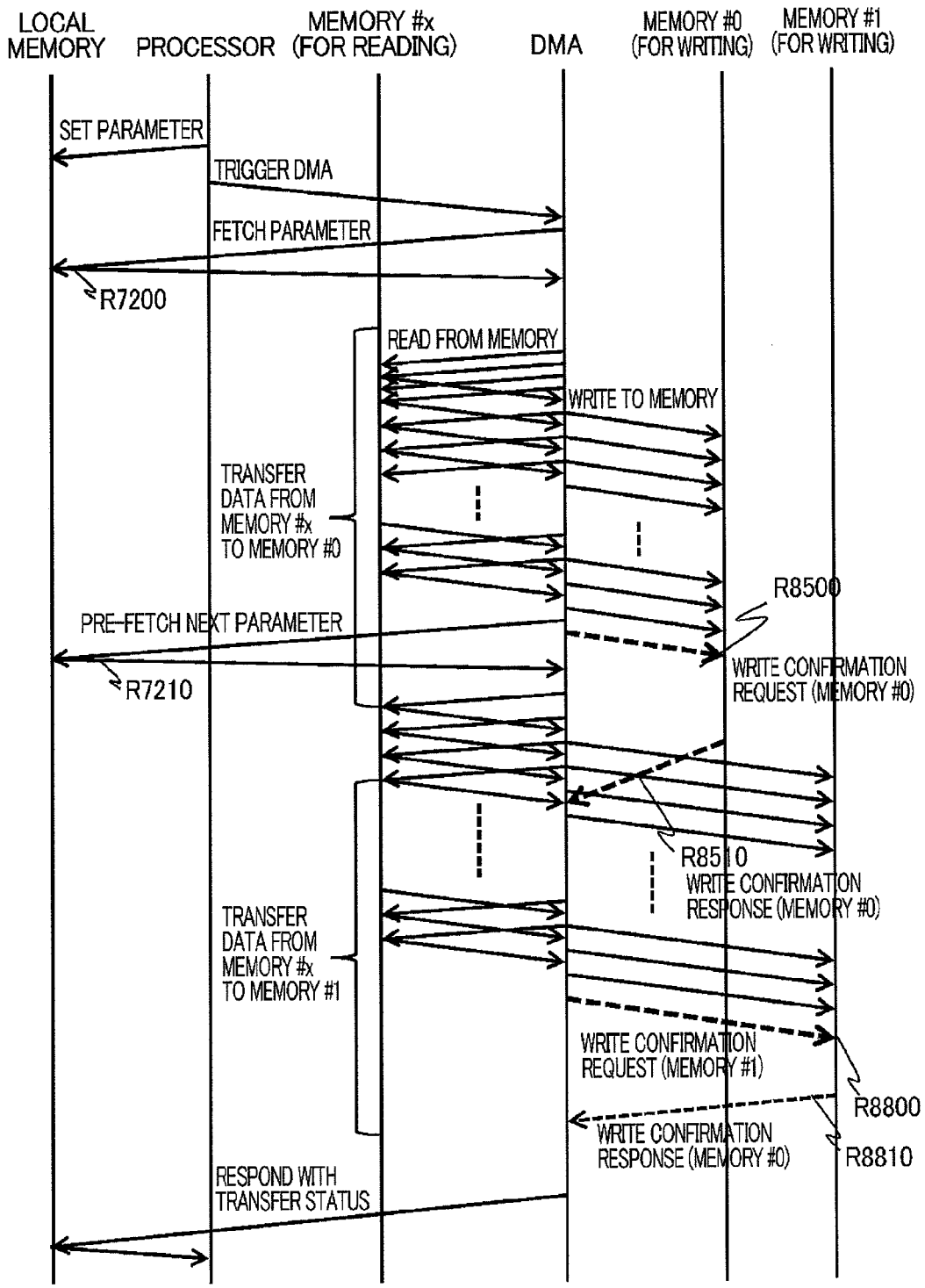
FIG. 12 is a ladder chart showing an operation procedure of the DMA of the data transfer control between memories in the modification of the embodiment of the present invention.

In this embodiment, a dummy read request (Non-Posted Access) is issued to ensure writing to the memory. However, the embodiment may be modified so that a dedicated command (write ensuring request) by use of Posted Access, which stays behind the preceding writing in advance, can be defined and then issued. For example, a TLP (Transaction Layer Packet) of the format as shown in FIG. 10 is defined as a write confirmation request. Then, when the write confirmation request is sent, the memory controller 230-233 flushes data in the buffer to the memory and then asynchronously returns a response (write confirmation response) by use of Posted Access as shown in FIG. 11. The sequence of this case becomes one that is shown in FIG. 12. In the case of this modification, unlike the case where a Non-Posted Access is used, each of the DMAs 210 to 212 does not have to secure the buffer for receiving response data (read response) and wait. Thereby, there is an additional effect that can enhance the parallelism of the operations and thus improve the performance. Here, an undefined request (TLP) is discarded in normal PCI Express, so that the definition to receive the aforementioned request and response is implemented in the PCI Express cores 221 and 223.

Modification 3 of Example 1

Figure 13:
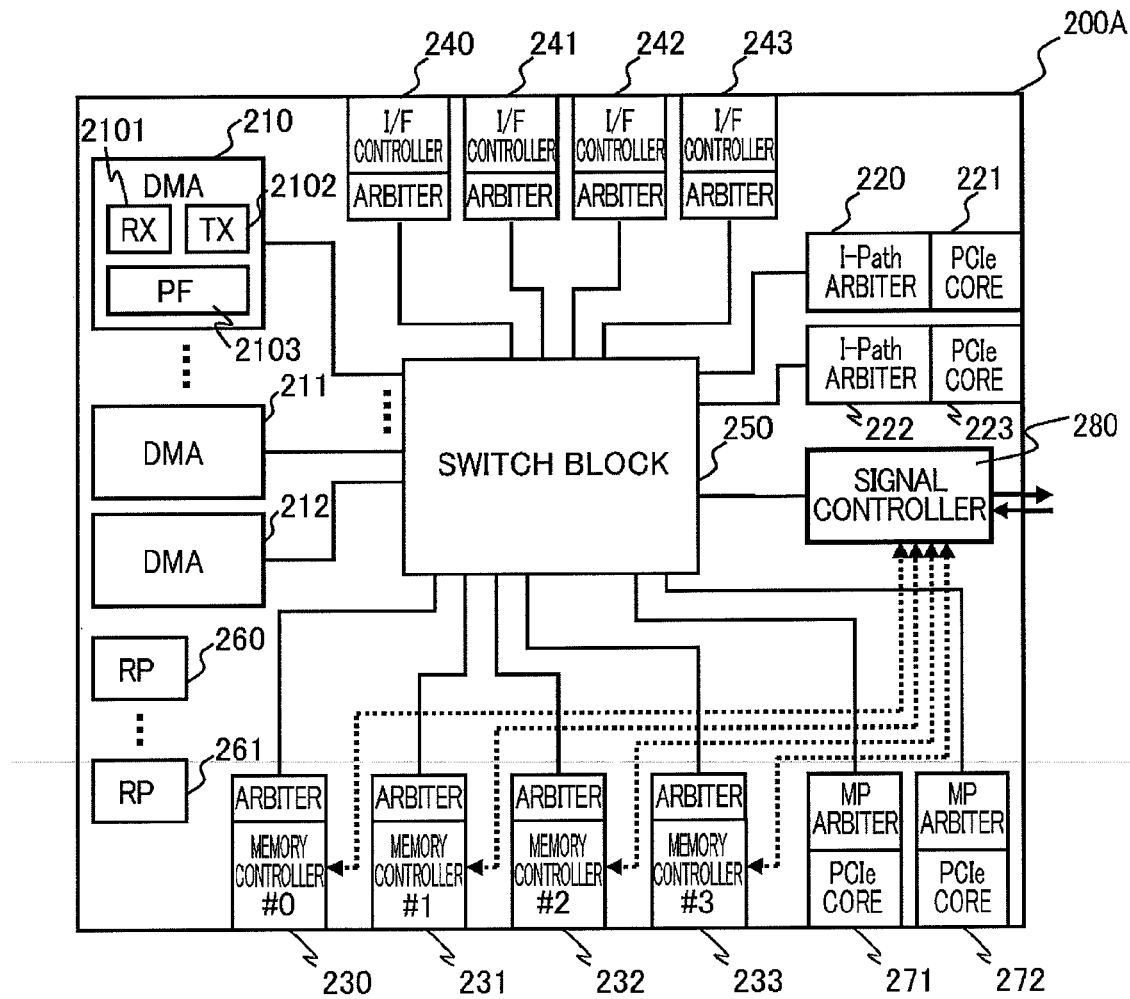
FIG. 13 is a block diagram showing an internal configuration of an ASIC in a modification of the embodiment of the present invention.

In this embodiment, a dummy read request is issued to a memory to ensure writing thereto. However, a dedicated signal line for a request to ensure writing may be implemented in the ASIC 200 and provided on the paths of the internal data transfer paths 101 and 102. FIG. 13 shows an implementation example of this case. When writing needs to be ensured, a corresponding one of the DMAs 210 to 212 instructs a signal controller 280 to send a signal to a corresponding one of the memory controllers 230 to 233 for which writing needs to be ensured. The signal includes information such as the number of transfers for the writing from the one of the DMAs 210 to 212, or the like. Then, the one of the memory controllers 230 to 233 returns an ensuring completion signal when the required number of transfers arrives, for example. In this manner, the corresponding one of the DMAs 210 to 212 can confirm, through the signal controller 280, that the writing is ensured. In the case of this modification, the request to ensure writing and the response do not pass through the data transfer paths. Thus, there is no influence on the data transfer. Accordingly, there is an additional effect that improves the transfer efficiency.

Modification 4 of Example 1

In this embodiment, writing is secured at the time of switching of the memory controllers 230-233. However, the writing may be secured on the unit of DIMM installed beyond the memory controllers 230-233. This configuration can be realized by modifying the embodiment so that the address areas are managed not for the memory controllers 230-233 but for the DIMMs and it is determined at S8050 in FIG. 7 whether or not the DIMM as an access destination is different from the previous one. Usually the DIMM is constructed with multiple memory chips and managed with a unit of bank. Therefore, similarly, the times of switching the banks in the DIMM may be the times for securing writing. In this case, the address areas are managed for the banks.

Modification 5 of Example 1

In this embodiment, the processing to ensure writing is performed at the timing when the memory planes switch from one to another. However, the processing to ensure writing may be performed periodically for each constant number of transfers even before the memory plane switches to another. In the case of this modification, writing can be periodically ensured even when data of very long transfer length is written to a memory, so that sureness of the writing of data can be improved, and further effect can be obtained such as facilitating recovery processing on error occurrence through performing frequent secure processings. In addition, the processors 760 and 761 may be configured to be capable of explicitly specifying the presence or absence of the necessity or the frequency of the processing to ensure writing in the transfer parameter. Alternatively, it is also possible to provide two different initiating trigger registers for the DMAs 210-212 and when initiated by one trigger register the DMAs 210-212 function with write secure processing, and when initiated by the other trigger register the DMAs 210-212 function without write secure processing. In this case, there is an additional effect that realizes reduction of an unnecessary operation to ensure writing and thereby improves the processing performance.

Modification 6 of Example 1

In this embodiment, the DMAs 210-212 read the parameters 300 and transfer data from memories to memories as instructed by the parameters 300. However, it is possible to provide another DMA for transferring small data written in a buffer or a register to the memories along with performing write secure processing. In addition, since the transfer length and the transfer source address can be known by the size and the address of the buffer or the register, it is possible to omit creating the parameters 300 for the DMA and to modify the initiating trigger register so that the transfer destination address is set therein. Further, the notification of transfer status to the processors 760, 761 may be omitted when the data transfer is normally completed. In the present modification of Example 1, there is an additional effect that overhead in transferring data by a small size for creating the parameters and/or for checking the transfer status is reduced, and thereby the processing performance in data transfer by a small size can be improved.

Note that, Modifications 1 to 6 described above may be combined as appropriate.

EXAMPLE 2

Example 2 will be described with reference to FIGS. 14 and 15.

The basic configuration of a device in Example 2 is the same as that of the storage device shown in FIG. 1, and the configuration of the storage controller is the same as the one shown in FIG. 3. However, the functions included in the ASIC 200 are different. In the description below, the portions different from Example 1 will be mainly described, and the description of the same portions will be omitted. Note that, since the ASIC 200A and the ASIC 200B have the same configuration, the alphabet symbol at the end of each of the reference numerals is omitted in the description below.

Figure 14:
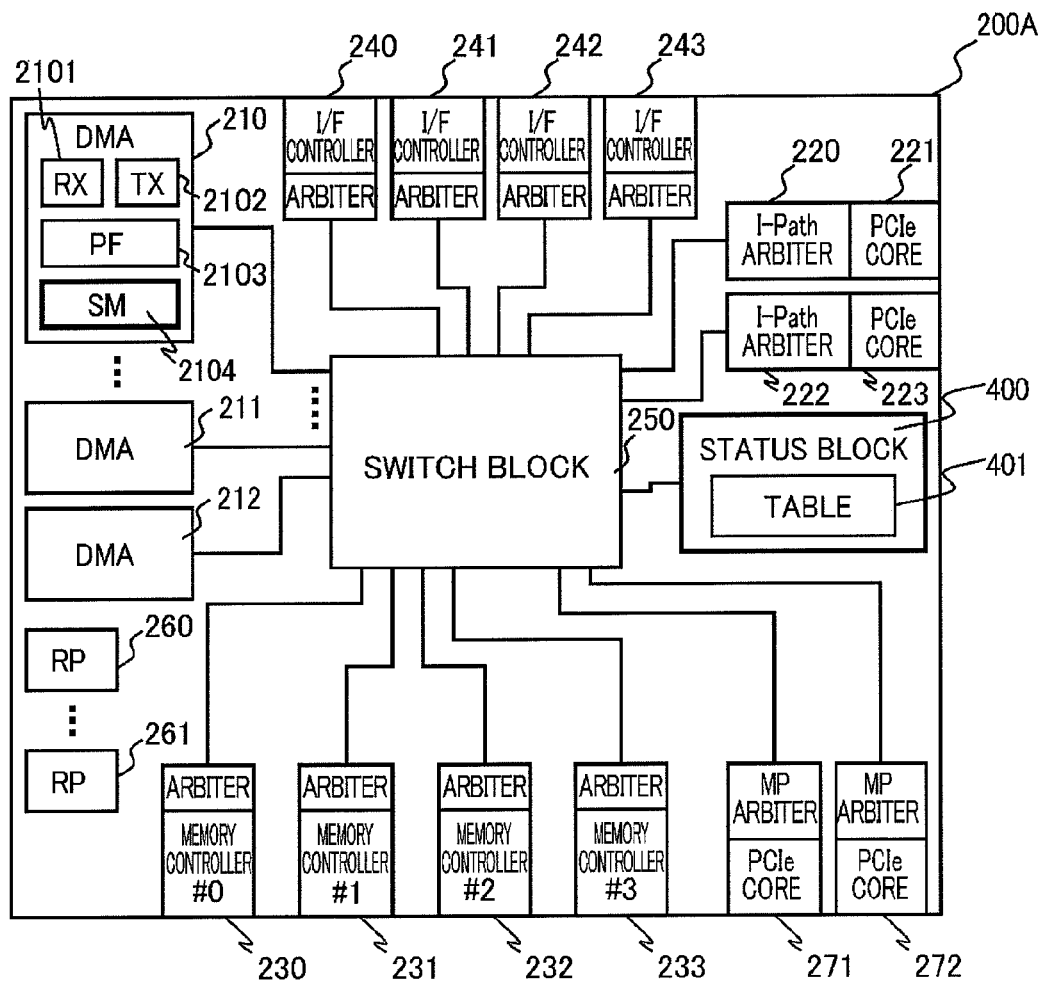
FIG. 14 is a block diagram showing an internal configuration of an ASIC in Example 2 of the present invention.

FIG. 14 shows a functional block diagram of the ASIC 200 in the storage controller in Example 2. A DMA status block 400 that manages statuses of the DMAs 210 to 212 is provided in the ASIC 200. Each of the DMAs 210 to 212 is provided with a status manager (SM) 2104 that manages the status of the DMA itself and that acquires information on the other DMAs 210 to 212.

The DMA status block 400 has a table 401 that shows a transfer status of each of the DMAs 210 to 212. Details of the table 401 will be described later with reference to FIG. 15. The status manager 2104 of each of the DMAs 210 to 212 accesses the DMA status block 400 via the switch block 250, then acquires a record of the information on the DMA itself and the information on the other DMAs 210 to 212, which is utilized for determining on a path selection.

Figure 15:
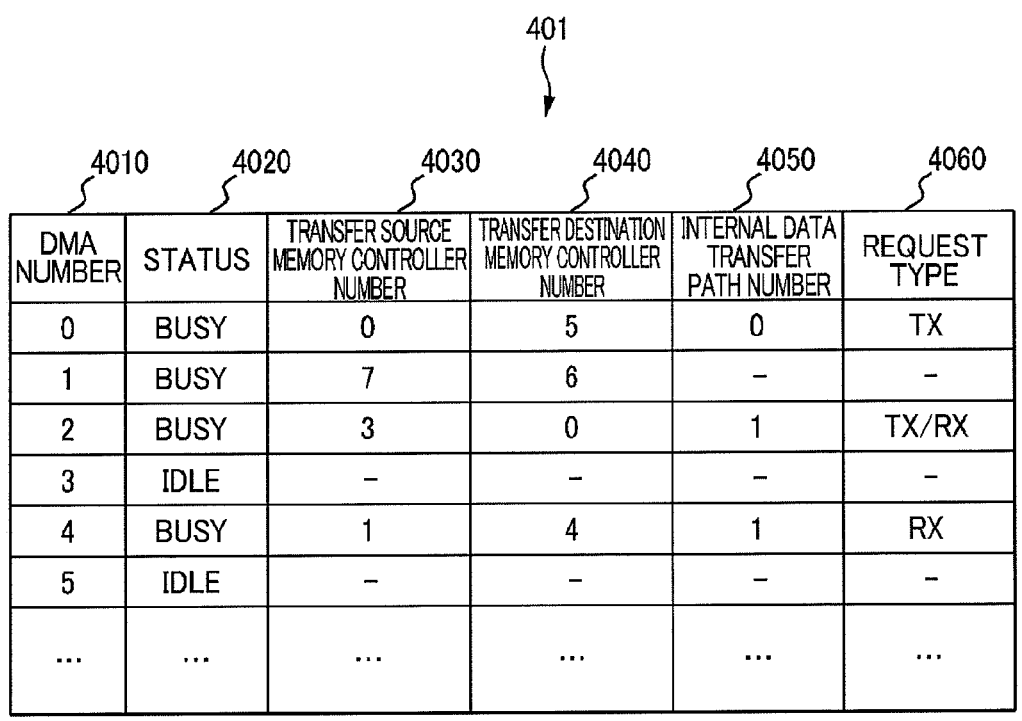
FIG. 15 is a diagram showing a configuration example of a table in the ASIC in Example 2 of the present invention.

FIG. 15 shows an example of the table 401 in the ASIC 200 of Example 2. The table 401 has the following fields: a number (DMA number) 4010 of each of the DMAs 210 to 212; a current status 4020; a transfer source memory controller number 4030; a transfer destination memory controller number 4040; an in-use internal data transfer path number 4050; a request type 4060; or the like.

The DMA number 4010 is the field where the number that identifies each of the DMAs 210 to 212 in a corresponding one of the ASICs 200A and 200B is stored. The current status 4020 is the field where whether the corresponding DMA is in a transfer (BUSY) state or a stop (IDLE) state is shown. The transfer source memory controller number 4030 shows the number that identifies one of the memory controllers 230 to 233 as transfer source, the memory controller specified by parameter analysis in a corresponding one of the DMAs 210 to 212. Likewise, the transfer destination memory controller number 4040 shows the number that identifies one of the memory controllers 230 to 233 as transfer destination, the memory controller specified by parameter analysis in a corresponding one of the DMAs 210 to 212. The internal data transfer path number 4050 shows the number that identifies the internal data transfer path 101 or 102 when data is transferred via one of the internal data transfer paths 101 and 102. The request type 4060 shows whether the internal data transfer path is used for reading (RX), writing (TX) or both (TX/RX). Note that in this embodiment, although the number of the field indicating the transfer destination memory controller number 4040 is one, when the DMA has a function of transferring data from one transfer source to multiple transfer destinations concurrently, the table 401 is configured to prepare multiple fields for the transfer destination memory controller numbers accordingly.

Figure 16:
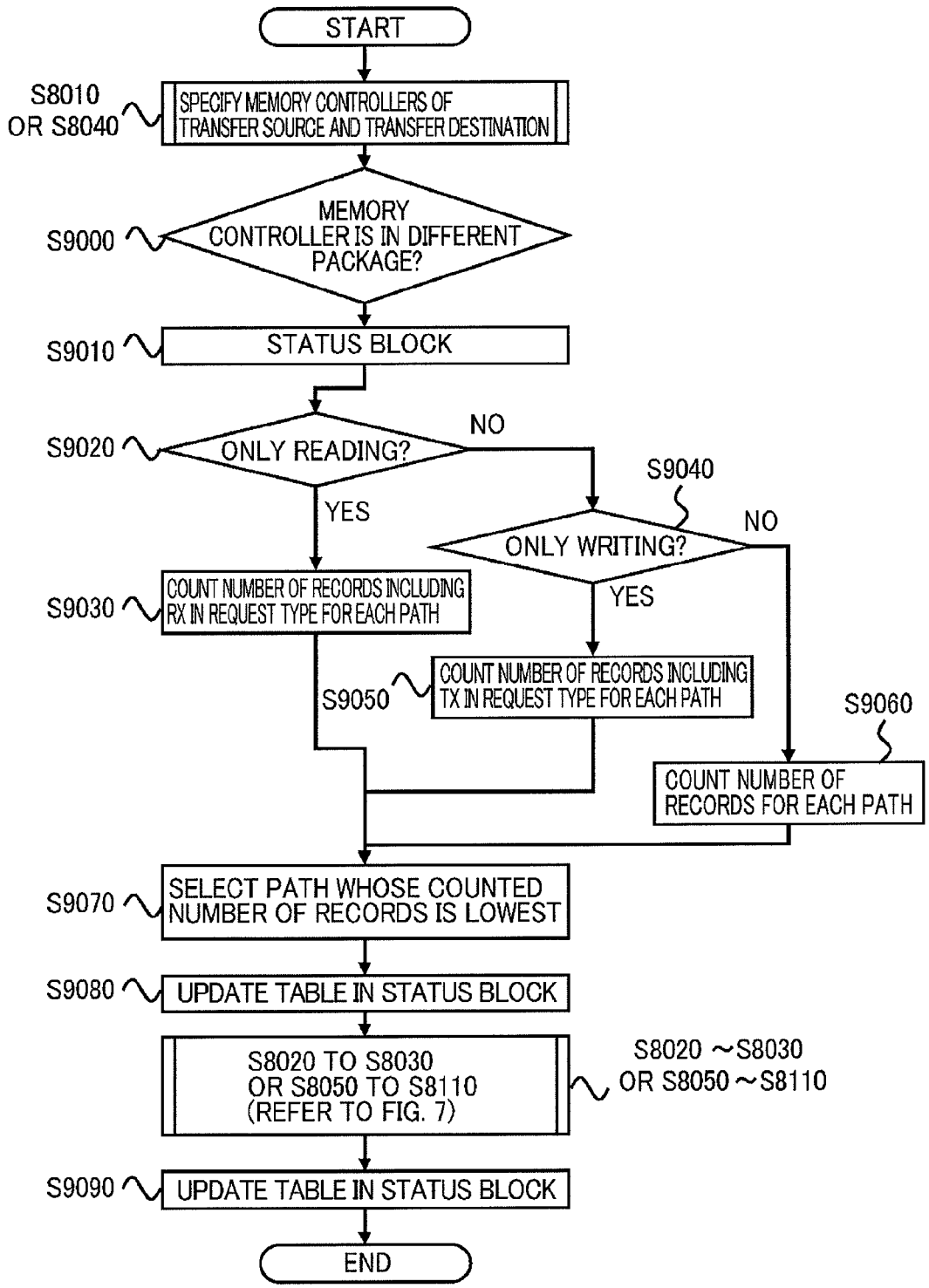
FIG. 16 is a flowchart describing an operation of a DMA in Example 2 of the present invention.

FIG. 16 shows an exemplary flowchart when the DMA 210 in this embodiment performs a transfer operation. Note that, each of the DMAs 211 and 212 performs the same operation as that of the DMA 210. The parameter fetch unit 2103 of the DMA 210 analyzes a parameter by use of the same method shown in FIG. 7 and then specifies the memory controllers 230 to 233 of the transfer source and the transfer destination (S8010 and S8040). As a result of the analysis, if a corresponding one of the memory controllers 230 to 233 of the transfer source or the transfer destination needs to be accessed via the internal data transfer path 101 or 102 (in other words, the memories M4 to M7 of the different package need to be accessed), the status manager 2104 of the DMA 210 accesses the DMA status block 400, thereby, determining which one of the internal data transfer paths 101 and 102 is to be used. Specifically, the status manager 2104 refers to the table 401 and then counts the number of records for each request type 4060 for each of the internal data transfer paths 101 and 102. If the access that uses the internal data transfer path 101 or 102 is reading (in other words, only the corresponding one of the memory controllers 230 to 233 of the transfer source corresponds to the memories M4 to M7 of the different package) (S9020: Yes), the status manager 2104 counts the number of records each including "RX" in the request type 4060 for each of the internal data transfer paths 101 and 102 (S9030). Meanwhile, if the access that uses the internal data transfer path 101 or 102 is writing (in other words, only the corresponding one of the memory controllers 230 to 233 of the transfer destination corresponds to the memories M4 to M7 of the different package) (S9040: Yes), the status manager 2104 counts the number of records each including "TX" in the request type 4060 for each of the internal data transfer paths 101 and 102 (S9050). If the access that uses the internal data transfer path 101 or 102 is both reading and writing (in other words, both of the memory controllers 230 to 233 of the transfer source and the transfer destination correspond to the memories M4 to M7 of the different package), the status manager 2104 counts the number of records for each of the internal data transfer paths 101 and 102 (S9060). The status manager 2104 selects one of the internal data transfer paths 101 and 102 whose number of records resulting from the aforementioned counting for the request type 4060 is the lowest (S9070). Then, the status manager 2104 updates the information on the record corresponding to the DMA 210 itself such as the memory controllers 230 to 233 to be used, the internal data transfer path number to be used and the like. For example, in a case where the number 4010 of the DMA 210 itself is "0," and data is to be transferred from the memory controller 0 of the same package as the DMA 210 to the memory controller 5 of the different package by use of the internal data transfer path 0 (101), the status manager 2104 sets "BUSY" in the status 4020, "0" in the transfer source memory controller number 4030, "5" in the transfer destination memory controller number 4040, "0" in the internal data path number 4050, and "TX" in the request type 4060 for the record having "0" in the DMA number 4010.

Upon completion of the transfer of the data in accordance with the parameter 300 (S8020 to S8030 or S8050 to S8110 in FIG. 7), the status manager 2104 of the DMA 210 again updates the status of the table 401 (S9090). Specifically, the status manager 2104 sets "IDLE" in the status 4020 corresponding to the DMA 210 itself, and clears the transfer source memory controller number 4030, the transfer destination memory controller number 4040, the internal data transfer path number 4050 and the request type 4060.

Effects of Example 2

According to Example 2, in a case where the multiple internal data transfer paths 101 and 102 exist, one of the internal data transfer paths 101 and 102 to be used for a data transfer can be selected while the use conditions of the internal data transfer paths 101 and 102 by the other resources (DMAs) are taken into account. Thus, an efficient transfer can be achieved. Here, as a conventional method that is used frequently, there is a method in which available transfer buffer spaces of the network paths are checked first for a path selection. However, with this method, when the multiple DMAs 210 to 212 check the available buffer spaces at slightly different times, all of the DMAs 210 to 212 may possibly select the same path. Accordingly, an efficient transfer cannot be performed in this case. In Example 2, each of the DMAs 210 to 212 that has referred to the table 401 updates the table 401 with the result of the selection. Accordingly, the next one of the DMAs 210 to 212 can determine which one of the internal data transfer paths 101 and 102 is to be used for a data transfer, while taking the result of the selection made by the previous one of the DMAs 210 to 212 into account. Thus, it is unlikely for all of the DMAs 210 to 212 to select the same one of the internal data transfer paths 101 and 102, thereby, allowing a more efficient path selection.

Modification 1 of Example 2

In Example 2, each of the DMAs 210 to 212 makes a determination on path selection with reference to the information of the other DMAs 210 to 212. However, the determination logic may be provided in the status block 400, and then, the DMAs 210 to 212 may be configured to send an inquiry to the status block 400. In this case, a path selector is provided in the status block 400, and each of the DMAs 210 to 212 sends a request including the memory controllers 230 to 233 of the transfer source and the transfer destination to the path selector. Then, the path selector performs the processing of S9000 to S9070 in FIG. 16 in accordance with the request and then responds with the selected internal data transfer path 101 or 102. In the case of present Modification 1, the path selection logic can be located at one location in a concentrated manner, so that there is a possibility to improve the implementation efficiency. In addition, there is an additional effect that facilitates prevention of information mismatch due to data writing during data reading or the like because the status block 400 can adjust the update timing of the records in the table 401.

Modification 2 of Example 2

Figure 17:
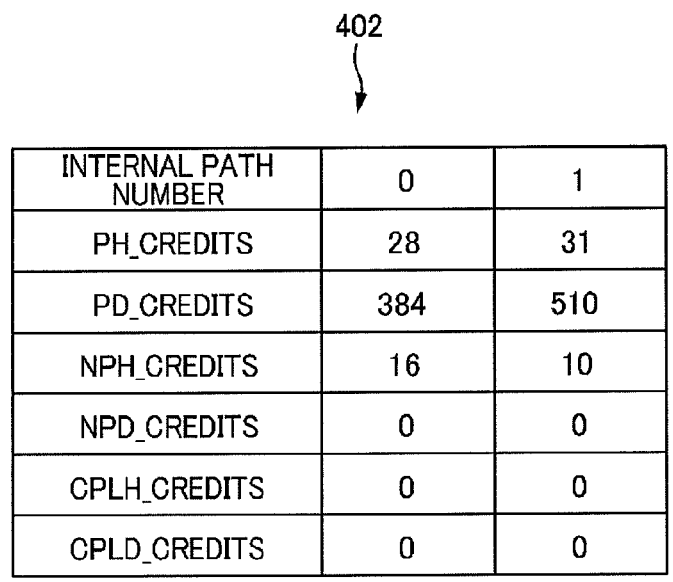
FIG. 17 is a diagram showing a configuration example of a table included in a status block 400 in a modification of Example 2 of the present invention.

In Example 2, the determination for a path selection is made with reference to the selection statuses of the internal data transfer paths 101 and 102 by each of the DMAs 210 to 212. However, the determination may be made while available statuses of buffers of the internal data transfer paths 101 and 102, the number of remaining transfer credits of PCI Express, or the like is taken into account in addition to aforementioned selection statuses. For example, such a determination can be made that the internal data transfer path 1 (102) can be selected when usage of the internal data transfer path 0 (101) is low, but the buffer is full. As an example, the aforementioned modification can be implemented by adding a function to monitor the amount of buffer used in each of the internal data transfer paths 101 and 102 to a corresponding one of the internal data transfer path arbiters 220 and 222, or adding a function to monitor the number of remaining transfer credits to each of the PCI Express cores 221 and 223. In Modification 2, the status block 400 is configured to store therein a table 402 as shown in FIG. 17, the table 402 storing therein the number of remaining transfer credits or the like. In the example of FIG. 17, more detailed credits of the buffers such as headers, data and the like are stored in the table 402. Specifically, the following credits are stored: Posted Header buffer CREDITS (PH_CREDITS); Posted Data buffer CREDITS (PD_CREDITS); Non-Posted Header buffer CREDITS (NPH_CREDITS); Non-Posted Data buffer CREDITS ((NPD_CREDITS); Completion Header buffer CREDITS (CPLH_CREDITS); and Completion Data buffer CREDITS (CPLD_CREDITS). In the case of the Posted-Access such as memory write requests, the reference can be made by comparing the number of remaining PH_CREDITS or PD_CREDITS, while in the case of the Non Posted-Access such as memory read requests, the reference can be made by comparing the number of remaining NPH_CREDITS or NPD_CREDITS. In the case of this modification, there is an additional effect that makes it possible to perform a path selection with a higher accuracy because the congestion situation of each of the internal data transfer paths 101, 102 can be taken into account.

Modification 3 of Example 2

In Example 2, the determination for a path selection is made with reference to the selection statuses of the internal data transfer paths 101 and 102 by each of the DMAs 210 to 212. However, the determination may be made while the use conditions regarding the transfer source memory controller number 4030 and the transfer destination memory controller number 4040 of the table 401 are taken into account in addition to the aforementioned selection statuses. Assume that an access to the memory controller 231 is made through the internal data transfer paths 101, 102. For example, in a case where the number of the DMAs 210 to 212 in the internal data transfer path 0 (101) is small, but all of the access destinations are the same memory controller 230, the buffer of the memory controller 230 may possibly become full, and thus the subsequent packets get stuck in the internal data transfer path 0. In this respect, a case is conceivable where the internal data transfer path 1 (102) is selected even if the number of the DMAs 210 to 212 that select the internal data transfer path 1 (102) is large. This Modification 3 can be realized by the configuration in that the status manager 2104 performs count, for each of the internal data transfer paths 101 and 102, in S9030, S9050 and S9060 only for the DMA whose transfer destination memory controller is the controller 231 for example. In the case of Modification 3, there is an additional effect that makes it possible to perform a path selection with high accuracy because the congestion situation of the memory controller of the access destination can be taken into account in addition to the congestion situation of each of the internal data transfer paths 101, 102.

Modification 4 of Example 2

In Example 2, the determination for a path selection is made with reference to the selection statuses of the internal data transfer paths 101 and 102 by each of the DMAs 210 to 212. However, in addition to this, more detailed information such as the transfer length, the number of transfer blocks or the number of remaining transfer blocks may be added in the table 401 and then used for making the determination. In the case of this modification, the accuracy for the path selection can be increased, and there is an additional effect that enables a more efficient determination.

Note that, Modifications 1 to 4 of Example 2 described above may be combined as appropriate.

EXAMPLE 3

Example 3 will be described with reference to FIGS. 18 to 20.

The basic configuration of a device in Example 3 is the storage device shown in FIG. 1, and the configuration of the storage controller is the same as the one shown in FIG. 3. However, the format of the parameter 300 used by the processors 760 and 761 to issue a transfer instruction to the DMAs 210 to 212 is different. In addition, Example 3 is different in that the processors 760 and 761 can notify or set the layout information of usage of the memories M0 to M7 to or in the ASIC 200. In the description below, the portions different from Examples 1 and 2 described above will be mainly described, and the description of the same portion will be omitted.

Figure 18:
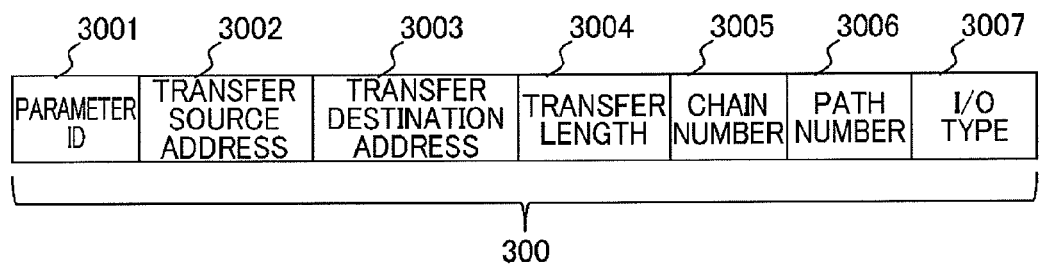
FIG. 18 is a diagram showing an example of a format of a transfer instruction parameter to a DMA controller in Example 3 of the present invention.

FIG. 18 is an example of the format of the parameter 300 generated by the processors 760 and 761 to issue a transfer instruction to the DMAs 210 to 212 in Example 3. In the parameter 300 of Example 3, in addition to the fields 3001 to 3006 included in the parameter 300 of the aforementioned embodiments, there is a (I/O type) field 3007 where the I/O type of the transfer and the priority of the processing are specified. The I/O type field 3007 is an eight-bit field, and the upper four-bit indicates the I/O type and the lower four-bit indicates the priority. For example, as the I/O types, a random I/O from a host is set to 1000b (binary digit), a sequential I/O from a host is set to 0100b, and a transfer for a synchronization function between volumes included in a storage is set to 0110b through 0111b according to the types. Meanwhile, as to the priorities, a transfer with the top priority is set to 1000b, while a transfer with the minimum priority is set to 0001b, and the like. Each of the processors 760 and 761 specifies the value by combining the aforementioned values when generating the parameter 300.

Figures 19, 20:
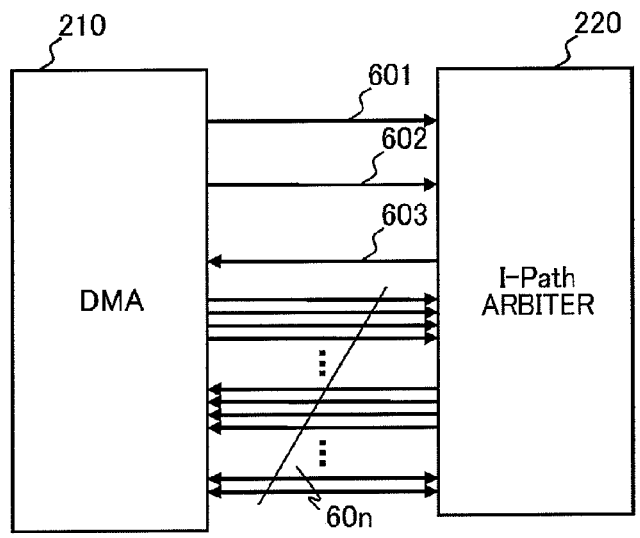
FIG. 19 is a diagram showing a configuration example of a memory layout information setting table in Example 3 of the present invention.
FIG. 20 is a diagram schematically showing exchange of data between a DMA and an internal data transfer path arbiter in Example 3 of the present invention.

FIG. 19 is a memory layout information setting table 800. This table is provided in a setting register of each of the internal data transfer path arbiters 220 and 222 in the ASIC 200. Here, the information in the memory layout information setting table 800 may be arranged at a different location as long as the internal data transfer path arbiters 220 and 222 can utilize the table, and the same effects can be obtained. For example, the memory layout information setting table 800 can be arranged in the local memories 770 and 771, the memories M0 to M7 or the like.

In the memory layout information setting table 800, memory ranges used by the DMAs 210 to 212 for a memory transfer are specified. In general, the entire regions of the memories M0 to M7 cannot be used as the cache memory regions of the storage, and a part of the memories M0 to M7 is used as a control information storage area of a protocol chip, a cache management information storage area of the processors 760 and 761, and the like. In this respect, a region other than the aforementioned regions is specified in this table 800, and thereby, it is made possible to notify the ASIC 200, particularly, the internal data transfer path arbiters 220 and 222 that a large number of accesses occurs to which one of the memory controllers 230 to 233, the internal data transfer path arbiters 220 and 222 controlling passing of data through the internal data transfer paths 101 and 102, respectively.

A configuration of the memory layout information table 800 will be described. In a memory number field 8010, a memory plane number is recorded. In Example 3, an assumption is made that the memory numbers match the numbers that show the memory controllers 230 to 233 corresponding to the memories M0 to M7. A start address field 8020 shows the start address of the effective range of access by the DMAs 210 to 212. An end address field 8030 shows the end address of the effective range of access by the DMAs 210 to 212. A ratio field 8040 is a field where a ratio showing the number of times the ASIC 200 accesses each of the memory controllers 230 to 233 is set. The value of the ratio is determined according to the size of the address range specified by the processors 760 and 761. In Example 3, while employing an area of a certain address space as a unit, the number of the address space existing in the address range is set as the ratio value. In the example shown in FIG. 19, the address space 1000h (addresses 0000h-0FFFh) is employed as a unit, and the ratio value 16 is set for the memory M2 and the memory M3 providing a space of 10000h, and the ratio value 5 is set for the memory M0 providing a space of 5000h. A counter field 8050 indicates a count value by an operation counter used by the arbiter for managing a change in the control ratio, and the same value as that of the ratio field 8040 is set in the counter field 8050 as the default value.

FIG. 20 is a diagram schematically showing exchanges of data between the DMA 210 and the internal data transfer path arbiter 220 in this embodiment. Since how data is exchanged between the DMAs 210 to 213 and the internal data transfer path arbiters 220 and 221 is the same, a description will be given using the DMA 210 and the internal data transfer path arbiter 220, herein. Between the DMA 210 and the internal data transfer path arbiter 220, the following signal lines exist: an REQ signal line 601 that requests the right of usage of the path from the DMA 210 to the internal data transfer path arbiter 220; an REQ_MEM_NO signal line 602 that transmits an access destination memory controller number at the time of issuing the request; an ACT signal line 603 that transmits permission of the right of usage of the path from the internal data transfer path arbiter 220 to the DMA 210; and various signal lines 60n for data to be sent and received between both of them, a signal for synchronization, communications of an error status and the like. The internal data transfer path arbiter 220, using the aforementioned group of signal lines, is capable of communicating with all of the DMAs 210 to 212 and the other resources in the ASIC 200 in the same controller that use the path via the switch block 250.

Figure 21:
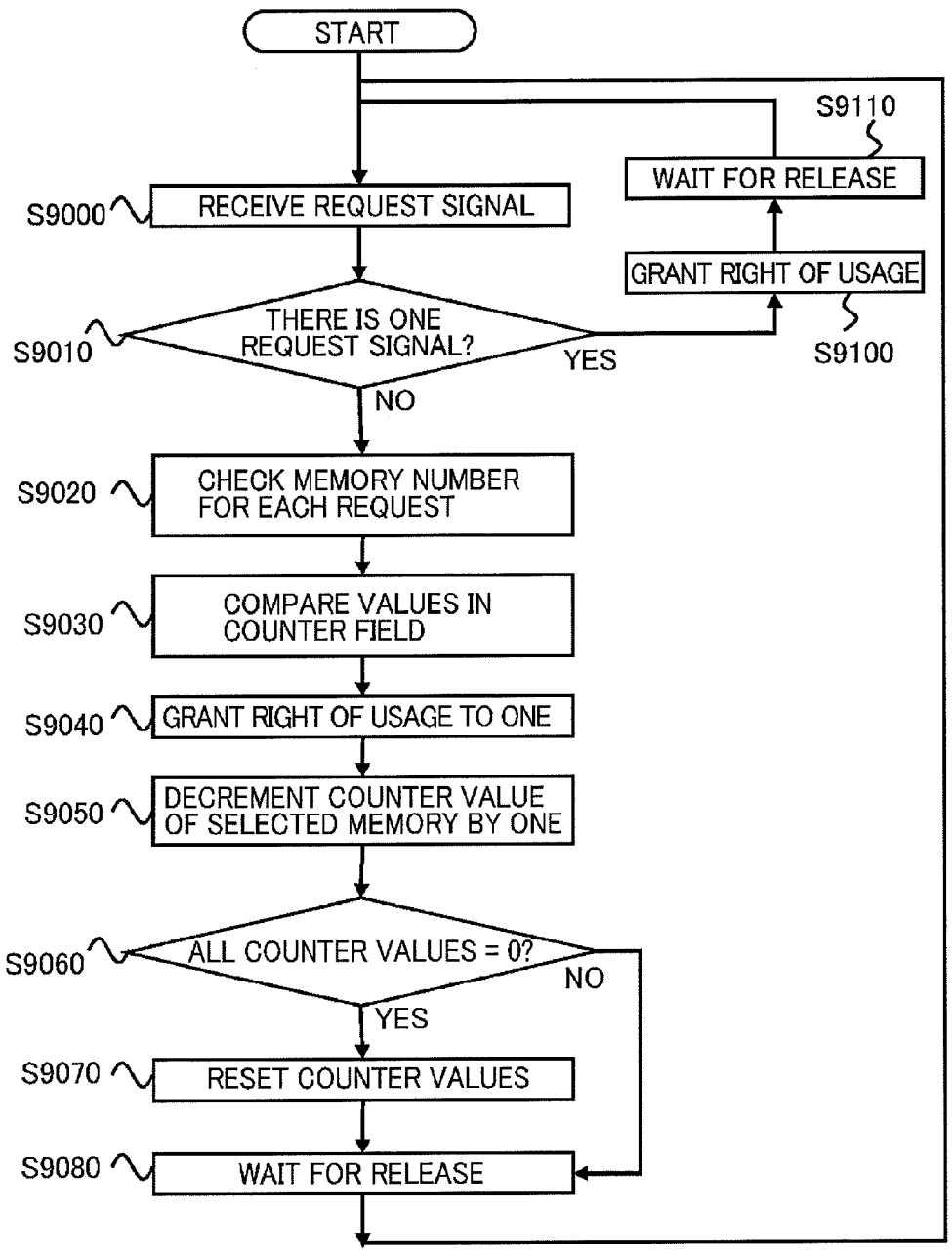
FIG. 21 is a flowchart showing an operation of the internal data transfer path arbiter in Example 3 of the present invention.

FIG. 21 is a flowchart showing an operation of the internal data transfer path arbiters 220 and 222 in Example 3. Hereinafter, the internal data transfer path arbiter is simply referred to as an arbiter. In addition, since the arbiters 220 and 222 perform the same operation, a description will be given of only the arbiter 220, herein.

When the DMAs 210 to 212 are started by the same procedure as the procedure shown in FIG. 5 described above, each of the DMAs 210 to 212 analyzes the parameter 300 and specifies one of the memory controllers 230 to 233 of the access destination by the same procedure as the procedure shown in FIG. 7. When accessing the one of the memory controllers 230 to 233 of the access destination via the internal data transfer path 101 or 102, each of the DMAs 210 to 212 sends a request signal for acquiring the right of usage of the path together with a signal showing the access destination memory controller number to the arbiter 220 via the REQ signal line 601 and the REQ_MEM_NO signal line 602.

Upon receipt of the request signals from the DMAs 210 to 212, the arbiter 220 starts an operation to control the right of usage in sequence (S9000).

When receiving one request signal (S9010: Yes), the arbiter 220 grants the right of usage for the received request signal (S9100) and returns an ACT signal via the ACT signal line 603. Upon receipt of the ACT signal, one of the DMAs performs a data transfer with the corresponding one of the memory controllers 230 to 233. Then, when the data transfer is completed, the DMA withdraws the REQ signal on the REQ signal line 601 (negates the signal) and then releases the right of usage. The arbiter 220 waits until the right of usage is released (S9110), and then waits for a request signal again.

If the arbiter 220 receives multiple requests at the same time, or there are multiple requests that are waiting to be processed (S9010: No), the arbiter 220 checks the access destination memory controller number signals as well as the request signals received via the REQ_MEM_NO signal line 602 (S9020). Then, the arbiter 220 compares the values of the counter fields 8050 corresponding to the respective memory controller numbers with reference to the memory layout information setting table 800 (S9030). Then, the arbiter 220 selects the memory controller number whose value in the counter field 8050 is the largest among the values of the memory controllers 230 to 233 that are requested as the access destinations, and then grants the right of usage of the path to one of the DMAs 210 to 212 that specifies the number (S9040). If multiple DMAs 210 to 212 are applicable, the arbiter 220 controls the right of usage by round robin. Then, the arbiter 220 performs processing to decrement the counter value corresponding to the memory controller by one and to lower the priority by one (S9050). When all of the counter values become 0 (S9060: Yes), the arbiter 220 resets the counter value of each of the memories with reference to the ratio field 8040 in order that the counter value of each of the memories can match the value of the ratio field 8040 (S9070). Then, the arbiter 220 waits for the granted right of usage to be released (S9080), and then waits for a signal again.

Effects of Example 3

According to Example 3, the memory resource usage information set by the processors 760 and 761, i.e., the control software is utilized, and thereby, the usage of the internal data transfer paths 101 and 102 can be more efficiently controlled than a case where the usage thereof is controlled by hardware alone. Thus, the data transfer via the internal data transfer paths 101 and 102 can be more efficient.

Although the three Examples and the modifications belonging thereto have been described above, the aforementioned Examples are provided to describe an example of the means to solve at least one of the problems cited in the present invention. Thus, the configurations thereof are not intended to impose any limitation on the present invention. In addition, the aforementioned Examples can be applied individually or in combination.

The present invention can be applied not only to one or multiple storage devices described in Examples 1 through 3 described above, as a matter of course, but also broadly applied to one or more data transfer devices coupled to each other via one or more networks of an environment without issuing a response indicating completion of writing is used in the device, without limited to PCI Express.

In the above, the embodiments have been described; however, the above-mentioned embodiments are intended to facilitate understanding of the present invention and not to be taken in a limiting sense. The present invention may be modified or improved without departing from the spirit of the invention, and the present invention also includes the equivalents thereof.

The invention claimed is:

1. A data transfer device that transfers data to a memory according to an instruction from a processor via a bus through which a response indicating completion of data writing in the memory is not sent back, comprising:
  an inter-memory data transfer control unit performing data transfer between the memories, the inter-memory data transfer control unit including
  an operation start trigger receiving unit for receiving an operation start trigger from the processor,
  a parameter acquiring unit for acquiring a transfer instruction parameter including information on a data transfer instruction created by the processor,
  a read unit for reading data from the memory designated by the transfer instruction parameter,
  a write unit for writing the data read by the read unit into the memory designated by the transfer instruction parameter, wherein
  when the write unit detects switching of a write destination memory from a first memory to a second memory, in order to confirm that writing into the first memory is completed, the write unit performs confirmation of write completion as to the first memory by a procedure different from writing into the memory,
  when a data transfer instructed by the processor is completed, in order to confirm that writing into the memory is completed as to the write destination memory at the end of the data transfer, the write unit performs confirmation of write completion as to the write destination memory at the end of the data transfer by the procedure different from writing into the memory, and
  the inter-memory data transfer control unit notifies the processor of completion of an inter-memory data transfer based on the confirmation of the write completion.

2. The data transfer device according to claim 1, wherein in order to confirm that writing into the memory is completed, the write unit of the inter-memory data transfer control unit performs reading from the memory through the same bus as used in writing into the memory as the procedure different from writing into the memory.

3. The data transfer device according to claim 1, wherein in order to confirm that writing into the memory is completed, the write unit of the inter-memory data transfer control unit performs access to a register in a memory controller through the same bus as used in writing into the memory as the procedure different from writing into the memory.

4. The data transfer device according to claim 3, wherein the memory controller is enabled to refer to at least one register provided in the memory controller for at least a number of times of writing by the memory controller.

5. The data transfer device according to claim 4, wherein in order to confirm that writing into the memory is completed, the inter-memory data transfer control unit performs reading from the register enabled to referring for the number of times of writing by the memory controller through the same bus as used in writing into the memory as the procedure different from writing into the memory, and
  the inter-memory data transfer control unit compares a value read from the register with the number of times of writing by the inter-memory data transfer control unit and confirms whether the data transfer is normally performed.

6. The data transfer device according to claim 1, wherein in order to confirm that writing into the memory is completed, the inter-memory data transfer control unit includes a write completion confirmation request/response processing unit for processing a write completion confirmation request dedicated to requesting for securing writing and a write completion confirmation response for response to the write completion confirmation request as the procedure different from writing into the memory,
  the inter-memory data transfer control unit confirms completion of the writing by sending the write completion confirmation request and receiving the write completion confirmation response.

7. The data transfer device according to claim 1, wherein the data transfer device includes a signal line between the inter-memory data transfer control unit and a memory controller for confirmation of securing writing and for response to the confirmation request, in order to confirm that writing into the memory is completed, as the procedure different from writing into the memory, the inter-memory data transfer control unit sends a signal for requesting confirmation of securing writing to the memory controller, the inter-memory data transfer control unit receives a signal of completion of securing writing that the memory controller having received the signal for requesting confirmation of securing writing sends to a request source as a response to the request for confirmation of securing writing when the memory controller detects completion of a requested writing, and the inter-memory data transfer control unit confirms completion of writing by receiving the signal of completion of securing writing.

8. The data transfer device according to claim 1, wherein the inter-memory data transfer control unit detects a timing of switching of the write destination memory from the first memory to the second memory by switching of an access destination memory controller.

9. The data transfer device according to claim 1, wherein the inter-memory data transfer control unit determines a timing of switching of the write destination memory from the first memory to the second memory with reference to an access destination address of the memory.

10. The data transfer device according to claim 9, wherein the inter-memory data transfer control unit determines a timing of switching of the write destination memory from the first memory to the second memory by the memory controller.

11. The data transfer device according to claim 9, wherein the inter-memory data transfer control unit determines a timing of switching of the write destination memory from the first memory to the second memory by the DIMM of the memory.

12. The data transfer device according to claim 9, wherein the inter-memory data transfer control unit determines a timing of switching of the write destination memory from the first memory to the second memory by the bank of the memory.

13. The data transfer device according to claim 1, wherein the transfer instruction parameter includes at least, as the information on a data transfer instruction, a start address of a transfer source memory, at least one start address of a transfer destination memory, necessity information on whether or not check of completion of writing to each transfer destination memory, and a transfer data length, when the write unit detects switching of the write destination memory from the first memory to the second memory, in order to confirm that writing into the first memory is completed, the write unit determines whether or not performing confirmation of write completion as to the first memory based on the necessity information in the transfer instruction parameter, when the write unit determines that the confirmation of write completion is required, the write unit performs confirmation of write completion as to the first memory by the procedure different from writing into the memory, when a data transfer instructed by the processor is completed, in order to confirm that writing into the memory is completed as to the write destination memory at the end of the data transfer, the write unit determines whether or not performing confirmation of write completion as to the write destination memory based on the necessity information in the transfer instruction parameter, and when the write unit determines that the confirmation of write completion is required, the write unit performs confirmation of write completion as to the write destination memory at the end of the data transfer by the procedure different from writing into the memory.

14. The data transfer device according to claim 1, wherein the inter-memory data transfer control unit includes two different-operation start trigger receiving units, if the inter-memory data transfer control unit is started by receiving the operation start trigger from one of the operation start trigger receiving units, when the inter-memory data transfer control unit detects switching of a write destination memory from the first memory to the second memory, in order to confirm that writing into the first memory is completed, the inter-memory data transfer control unit performs confirmation of write completion as to the first memory by the procedure different from writing into the memory, when a data transfer instructed by the processor is completed, in order to confirm that writing into the memory is completed as to the write destination memory at the end of the data transfer, the inter-memory data transfer control unit performs confirmation of write completion as to the write destination memory at the end of the data transfer by the procedure different from writing into the memory, and the inter-memory data transfer control unit notifies the processor of completion of an inter-memory data transfer based on the confirmation of write completion;

if the inter-memory data transfer control unit is started by receiving the operation start trigger from the other one of the operation start trigger receiving units, the inter-memory data transfer control unit omits performing confirmation of write completion as to the write destination memory, and the inter-memory data transfer control unit notifies the processor of completion of the inter-memory data transfer.

15. A data transfer method for transferring data to a memory via a bus through which a response indicating completion of data writing in the memory is not sent back, using an inter-memory data transfer control unit performing data transfer between the memories according to an instruction from a processor, comprising:

when the inter-memory data transfer control unit receives an operation start trigger from the processor, acquiring by the inter-memory data transfer control unit a transfer instruction parameter including information on a data transfer instruction created by the processor, reading by the inter-memory data transfer control unit repetitively data from the memory designated by the transfer instruction parameter until a data length of the read data amounts to a transfer length designated by the transfer instruction parameter, writing by the inter-memory data transfer control unit repetitively the read data to the memory designated by the transfer instruction parameter until a data length of the written data amounts to a transfer length designated by the transfer instruction parameter on data writing by the inter-memory data transfer control unit, when the inter-memory data transfer control unit detects switching of a write destination memory from a first memory to a second memory, in order to confirm that writing into the first memory is completed, performing by the inter-memory data transfer control unit confirmation of write completion as to the first memory by a procedure different from writing into the memory, when a data transfer instructed by the processor is completed, in order to confirm that writing into the memory is completed as to the write destination memory at the end of the data transfer, performing by the inter-memory data transfer control unit confirmation of write completion as to the write destination memory at the end of the data transfer by the procedure different from writing into the memory, and notifying the processor of completion of an inter-memory data transfer based on the confirmation of write completion by the inter-memory data transfer control unit.

16. The data transfer method according to claim 15, wherein in order to confirm that writing into the memory is completed, the inter-memory data transfer control unit performs reading from the memory through the same bus as used in writing into the memory as the procedure different from writing into the memory.

17. The data transfer method according to claim 15, wherein in order to confirm that writing into the memory is completed, the inter-memory data transfer control unit performs reading from a register in a memory controller through the same bus as used in writing into the memory as the procedure different from writing into the memory.

18. The data transfer method according to claim 17, wherein in order to confirm that writing into the memory is completed, the inter-memory data transfer control unit performs reading from the register enabled to referring for the number of times of writing by the memory controller through the same bus as used in writing into the memory as the procedure different from writing into the memory, and the inter-memory data transfer control unit compares a value read from the register with the number of times of writing by the inter-memory data transfer control unit and confirms whether the data transfer is normally performed.

19. The data transfer method according to claim 15, wherein in order to confirm that writing into the memory is completed, the inter-memory data transfer control unit confirms completion of the writing by sending a write completion confirmation request dedicated to requesting for securing writing and normally receiving a write completion confirmation response for responding to the write completion confirmation request, as the procedure different from writing into the memory.

20. The data transfer method according to claim 15, wherein the inter-memory data transfer control unit detects a timing of switching of the write destination memory from the first memory to the second memory by switching of an access destination memory controller.

21. The data transfer method according to claim 15, wherein the inter-memory data transfer control unit determines a timing of switching of the write destination memory from the first memory to the second memory with reference to an access destination address of the memory.

22. The data transfer method according to claim 21, wherein the inter-memory data transfer control unit manages a timing of switching of the write destination memory from the first memory to the second memory by the memory controller.

23. The data transfer method according to claim 21, wherein the inter-memory data transfer control unit manages a timing of switching of the write destination memory from the first memory to the second memory by the DIMM of the memory.

24. The data transfer method according to claim 21, wherein the inter-memory data transfer control unit manages a timing of switching of the write destination memory from the first memory to the second memory by the bank of the memory.

25. The data transfer method according to claim 15, wherein on data writing by the inter-memory data transfer control unit, when the inter-memory data transfer control unit detects switching of the write destination memory from the first memory to the second memory, the inter-memory data transfer control unit determines whether or not performing confirmation of write completion as to the first memory based on necessity information on whether or not confirmation of completion of writing to each transfer destination memory in the transfer instruction parameter, when the inter-memory data transfer control unit determines that the confirmation of write completion is required, the inter-memory data transfer control unit performs confirmation of write completion as to the first memory by the procedure different from writing into the memory, when a data transfer instructed by the processor is completed, the inter-memory data transfer control unit determines whether or not performing confirmation of write completion as to the write destination memory at the end of the data transfer based on the necessity information in the transfer instruction parameter, and when the inter-memory data transfer control unit determines that the confirmation of write completion is required, the inter-memory data transfer control unit performs confirmation of write completion as to the write destination memory at the end of the data transfer by the procedure different from writing into the memory.

* * * * *